(12) United States Patent
D'Evelyn et al.

(10) Patent No.: US 8,946,865 B2
(45) Date of Patent: *Feb. 3, 2015

(54) GALLIUM—NITRIDE-ON-HANDLE SUBSTRATE MATERIALS AND DEVICES AND METHOD OF MANUFACTURE

(71) Applicant: Soraa, Inc., Fremont, CA (US)

(72) Inventors: Mark P. D'Evelyn, Santa Barbara, CA (US); Arpan Chakraborty, Chandler, AZ (US); William D. Houck, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/301,520

(22) Filed: Jun. 11, 2014

(65) Prior Publication Data

US 2014/0346546 A1    Nov. 27, 2014

Related U.S. Application Data

(63) Continuation of application No. 13/012,674, filed on Jan. 24, 2011, now Pat. No. 8,786,053.

(51) Int. Cl.
*H01L 29/06* (2006.01)
*H01L 31/0304* (2006.01)
(Continued)

(52) U.S. Cl.
CPC ................ *H01L 33/32* (2013.01); *H01L 33/22* (2013.01); *H01L 33/50* (2013.01)
USPC .............................. 257/617; 257/76; 257/618

(58) Field of Classification Search
CPC ............... H01L 21/76254; H01L 2221/68327; H01L 29/02; H01L 33/0079
USPC ........................................................ 257/617
See application file for complete search history.

(56) References Cited

U.S. PATENT DOCUMENTS 3,245,760 A    4/1966 Sawyer
3,303,053 A    2/1967 Strong et al.
(Continued)

FOREIGN PATENT DOCUMENTS

EP    2381490    10/2011
JP    06-334215    12/1994
(Continued)

OTHER PUBLICATIONS

Aguilar, 'Ohmic n-contacts to Gallium Nitride Light Emitting Diodes', National Nanotechnoloighy Infrastructure Network, 2007, p. 56-81.
Baker et al., 'Characterization of Planar Semipolar Gallium Nitride Films on Spinel Substrates', Japanese Journal of Applied Physics, vol. 44, No. 29, 2005, pp. L920-L922.
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
(Continued)

*Primary Examiner* — Shaun Campbell
*Assistant Examiner* — Raj R Gupta
(74) *Attorney, Agent, or Firm* — Kilpatrick Townsend & Stockton LLP

(57)    ABSTRACT

A gallium and nitrogen containing substrate structure includes a handle substrate member having a first surface and a second surface and a transferred thickness of gallium and nitrogen material. The structure has a gallium and nitrogen containing active region grown overlying the transferred thickness and a recessed region formed within a portion of the handle substrate member. The substrate structure has a conductive material formed within the recessed region configured to transfer thermal energy from at least the transferred thickness of gallium and nitrogen material.

20 Claims, 21 Drawing Sheets

(51) Int. Cl.
*H01L 31/0352* (2006.01)
*H01L 31/036* (2006.01)
*H01L 33/32* (2010.01)
*H01L 33/22* (2010.01)
*H01L 33/50* (2010.01)

(56) References Cited

U.S. PATENT DOCUMENTS

| | | |
|---|---|---|
| 3,335,084 A | 8/1967 | Hall |
| 3,647,522 A | 3/1972 | Single |
| 4,030,966 A | 6/1977 | Hornig et al. |
| 4,065,688 A | 12/1977 | Thornton |
| 4,430,051 A | 2/1984 | von Platen |
| 4,870,045 A | 9/1989 | Gasper et al. |
| 5,331,654 A | 7/1994 | Jewell et al. |
| 5,607,899 A | 3/1997 | Yoshida et al. |
| 5,632,812 A | 5/1997 | Hirabayashi |
| 5,685,885 A | 11/1997 | Khandros et al. |
| 5,764,674 A | 6/1998 | Hibbs-Brenner et al. |
| 5,813,753 A | 9/1998 | Vriens et al. |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,335,771 B1 | 1/2002 | Hiraishi |
| 6,350,191 B1 | 2/2002 | D'Evelyn |
| 6,372,002 B1 | 4/2002 | D'Evelyn et al. |
| 6,398,867 B1 | 6/2002 | D'Evelyn et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,498,355 B1 | 12/2002 | Harrah et al. |
| 6,501,154 B2 | 12/2002 | Morita et al. |
| 6,509,651 B1 | 1/2003 | Matsubara et al. |
| 6,533,874 B1 | 3/2003 | Vaudo et al. |
| 6,541,115 B2 | 4/2003 | Pender et al. |
| 6,547,249 B2 | 4/2003 | Collins, III et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,680,959 B2 | 1/2004 | Tanabe et al. |
| 6,734,461 B1 | 5/2004 | Shiomi et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,809,781 B2 | 10/2004 | Setlur et al. |
| 6,858,882 B2 | 2/2005 | Tsuda et al. |
| 6,860,628 B2 | 3/2005 | Robertson et al. |
| 6,861,130 B2 | 3/2005 | D'Evelyn et al. |
| 6,936,488 B2 | 8/2005 | D'Evelyn et al. |
| 6,955,719 B2 | 10/2005 | Dmitriev et al. |
| 6,956,246 B1 | 10/2005 | Epler et al. |
| 7,001,577 B2 | 2/2006 | Zimmerman et al. |
| 7,009,199 B2 | 3/2006 | Hall |
| 7,009,215 B2 | 3/2006 | D'Evelyn et al. |
| 7,012,279 B2 | 3/2006 | Wierer, Jr. et al. |
| 7,026,755 B2 | 4/2006 | Setlur et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,128,849 B2 | 10/2006 | Setlur et al. |
| 7,160,388 B2 | 1/2007 | Dwili ski et al. |
| 7,160,531 B1 | 1/2007 | Jacques et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,285,801 B2 | 10/2007 | Eliashevich et al. |
| 7,291,544 B2 | 11/2007 | D'Evelyn et al. |
| 7,303,630 B2 | 12/2007 | Motoki et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,341,880 B2 * | 3/2008 | Erchak et al. .................. 438/26 |
| 7,348,600 B2 | 3/2008 | Narukawa et al. |
| 7,358,542 B2 | 4/2008 | Radkov et al. |
| 7,358,543 B2 | 4/2008 | Chua et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,390,359 B2 | 6/2008 | Miyanaga et al. |
| 7,419,281 B2 | 9/2008 | Porchia et al. |
| 7,420,261 B2 | 9/2008 | Dwili ski et al. |
| 7,470,938 B2 | 12/2008 | Lee et al. |
| 7,483,466 B2 | 1/2009 | Uchida et al. |
| 7,489,441 B2 | 2/2009 | Scheible et al. |
| 7,518,159 B2 | 4/2009 | Masui et al. |
| 7,566,639 B2 | 7/2009 | Kohda |
| 7,572,425 B2 | 8/2009 | McNulty et al. |
| 7,622,742 B2 | 11/2009 | Kim et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,733,571 B1 | 6/2010 | Li |
| 7,759,710 B1 | 7/2010 | Chiu et al. |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,923,741 B1 | 4/2011 | Zhai et al. |
| 7,976,630 B2 | 7/2011 | Poblenz et al. |
| 8,021,481 B2 | 9/2011 | D'Evelyn |
| 8,044,412 B2 | 10/2011 | Murphy et al. |
| 8,048,225 B2 | 11/2011 | Poblenz et al. |
| 8,097,081 B2 | 1/2012 | D'Evelyn |
| 8,142,566 B2 | 3/2012 | Kiyomi et al. |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,284,810 B1 | 10/2012 | Sharma et al. |
| 8,293,551 B2 | 10/2012 | Sharma et al. |
| 8,299,473 B1 | 10/2012 | D'Evelyn et al. |
| 8,303,710 B2 | 11/2012 | D'Evelyn |
| 8,304,265 B2 | 11/2012 | Nakamura et al. |
| 8,306,081 B1 | 11/2012 | Schmidt et al. |
| 8,310,143 B2 | 11/2012 | Van De Ven et al. |
| 8,314,429 B1 | 11/2012 | Raring et al. |
| 8,323,405 B2 | 12/2012 | D'Evelyn |
| 8,329,511 B2 | 12/2012 | D'Evelyn |
| 8,350,273 B2 | 1/2013 | Vielemeyer |
| 8,455,894 B1 | 6/2013 | D'Evelyn et al. |
| 8,477,259 B2 | 7/2013 | Kubota et al. |
| 8,502,465 B2 | 8/2013 | Katona et al. |
| 8,524,578 B1 | 9/2013 | Raring et al. |
| 8,575,728 B1 | 11/2013 | Raring et al. |
| 8,686,431 B2 | 4/2014 | Batres et al. |
| 8,786,053 B2 | 7/2014 | D'Evelyn et al. |
| 8,791,499 B1 | 7/2014 | Sharma et al. |
| 2001/0009134 A1 | 7/2001 | Kim et al. |
| 2001/0011935 A1 | 8/2001 | Lee et al. |
| 2001/0043042 A1 | 11/2001 | Murazaki et al. |
| 2001/0048114 A1 | 12/2001 | Morita et al. |

(56) References Cited

U.S. PATENT DOCUMENTS

| | | |
|---|---|---|
| 2001/0055208 A1 | 12/2001 | Kimura |
| 2002/0070416 A1 | 6/2002 | Morse et al. |
| 2002/0096994 A1 | 7/2002 | Iwafuchi et al. |
| 2002/0105986 A1 | 8/2002 | Yamasaki |
| 2002/0127824 A1 | 9/2002 | Shelton et al. |
| 2002/0155691 A1 | 10/2002 | Lee et al. |
| 2002/0182768 A1 | 12/2002 | Morse et al. |
| 2002/0189532 A1 | 12/2002 | Motoki et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0027014 A1 | 2/2003 | Johnson et al. |
| 2003/0047076 A1 | 3/2003 | Liu |
| 2003/0080345 A1 | 5/2003 | Motoki et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0207998 A1 | 10/2004 | Suehiro et al. |
| 2004/0222357 A1 | 11/2004 | King et al. |
| 2004/0245543 A1 | 12/2004 | Yoo |
| 2004/0251471 A1 | 12/2004 | Dwilinski et al. |
| 2005/0001227 A1 | 1/2005 | Niki et al. |
| 2005/0012446 A1 | 1/2005 | Jermann et al. |
| 2005/0045894 A1 | 3/2005 | Okuyama et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128459 A1 | 6/2005 | Zwet et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0199899 A1 | 9/2005 | Lin et al. |
| 2005/0205215 A1 | 9/2005 | Giddings et al. |
| 2005/0214992 A1 | 9/2005 | Chakraborty et al. |
| 2005/0224830 A1 | 10/2005 | Blonder et al. |
| 2005/0232327 A1 | 10/2005 | Nomura et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0038542 A1 | 2/2006 | Park et al. |
| 2006/0048699 A1 | 3/2006 | D'Evelyn et al. |
| 2006/0060131 A1 | 3/2006 | Atanackovic |
| 2006/0060872 A1 | 3/2006 | Edmond et al. |
| 2006/0079082 A1 | 4/2006 | Bruhns et al. |
| 2006/0096521 A1 | 5/2006 | D'Evelyn et al. |
| 2006/0118799 A1 | 6/2006 | D'Evelyn et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0177362 A1 | 8/2006 | D'Evelyn et al. |
| 2006/0186418 A1 | 8/2006 | Edmond et al. |
| 2006/0189098 A1 | 8/2006 | Edmond |
| 2006/0204865 A1 | 9/2006 | Erchak et al. |
| 2006/0205199 A1 | 9/2006 | Baker et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0273339 A1 | 12/2006 | Steigerwald et al. |
| 2006/0289386 A1 | 12/2006 | Tysoe et al. |
| 2007/0015345 A1 | 1/2007 | Baker et al. |
| 2007/0045200 A1 | 3/2007 | Moon et al. |
| 2007/0057337 A1 | 3/2007 | Kano et al. |
| 2007/0062440 A1* | 3/2007 | Sato et al. ............... 117/91 |
| 2007/0072324 A1 | 3/2007 | Krames et al. |
| 2007/0077674 A1 | 4/2007 | Okuyama et al. |
| 2007/0093073 A1 | 4/2007 | Farrell et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0202624 A1 | 8/2007 | Yoon et al. |
| 2007/0210074 A1 | 9/2007 | Maurer et al. |
| 2007/0215033 A1 | 9/2007 | Imaeda et al. |
| 2007/0228404 A1 | 10/2007 | Tran et al. |
| 2007/0231978 A1 | 10/2007 | Kanamoto et al. |
| 2007/0234946 A1 | 10/2007 | Hashimoto et al. |
| 2007/0252164 A1 | 11/2007 | Zhong et al. |
| 2007/0264733 A1 | 11/2007 | Choi et al. |
| 2007/0274359 A1 | 11/2007 | Takeuchi et al. |
| 2007/0280320 A1 | 12/2007 | Feezell et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0121913 A1 | 5/2008 | McKenzie et al. |
| 2008/0128752 A1 | 6/2008 | Wu |
| 2008/0142781 A1 | 6/2008 | Lee |
| 2008/0156254 A1 | 7/2008 | Dwilinski et al. |
| 2008/0164489 A1 | 7/2008 | Schmidt et al. |
| 2008/0164578 A1 | 7/2008 | Tanikella et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0193363 A1 | 8/2008 | Tsuji |
| 2008/0194054 A1 | 8/2008 | Lin et al. |
| 2008/0198881 A1 | 8/2008 | Farrell et al. |
| 2008/0210958 A1 | 9/2008 | Senda et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0261381 A1 | 10/2008 | Akiyama et al. |
| 2008/0272462 A1 | 11/2008 | Shimamoto et al. |
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0285609 A1 | 11/2008 | Ohta et al. |
| 2008/0298409 A1 | 12/2008 | Yamashita et al. |
| 2008/0303033 A1 | 12/2008 | Brandes |
| 2009/0032828 A1 | 2/2009 | Romano et al. |
| 2009/0065798 A1 | 3/2009 | Masui et al. |
| 2009/0071394 A1 | 3/2009 | Nakahata et al. |
| 2009/0072252 A1 | 3/2009 | Son et al. |

(56) References Cited

U.S. PATENT DOCUMENTS

| | | |
|---|---|---|
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0092536 A1 | 4/2009 | Kawabata et al. |
| 2009/0140279 A1 | 6/2009 | Zimmerman et al. |
| 2009/0146170 A1 | 6/2009 | Zhong et al. |
| 2009/0155989 A1 | 6/2009 | Uematsu et al. |
| 2009/0194796 A1 | 8/2009 | Hashimoto et al. |
| 2009/0206354 A1 | 8/2009 | Kitano et al. |
| 2009/0213593 A1 | 8/2009 | Foley et al. |
| 2009/0218593 A1 | 9/2009 | Kamikawa et al. |
| 2009/0227056 A1 | 9/2009 | Kyono et al. |
| 2009/0250686 A1 | 10/2009 | Sato et al. |
| 2009/0252191 A1 | 10/2009 | Kubota et al. |
| 2009/0267098 A1 | 10/2009 | Choi |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0315480 A1 | 12/2009 | Yan et al. |
| 2009/0320744 A1 | 12/2009 | D'Evelyn |
| 2009/0320745 A1 | 12/2009 | D'Evelyn et al. |
| 2009/0321745 A1 | 12/2009 | Kinoshita et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0006876 A1 | 1/2010 | Moteki et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0055819 A1 | 3/2010 | Ohba et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0147210 A1 | 6/2010 | D'Evelyn |
| 2010/0148145 A1 | 6/2010 | Ishibashi et al. |
| 2010/0149814 A1 | 6/2010 | Zhai et al. |
| 2010/0151194 A1 | 6/2010 | D'Evelyn |
| 2010/0155746 A1 | 6/2010 | Ibbetson et al. |
| 2010/0195687 A1 | 8/2010 | Okamoto et al. |
| 2010/0200837 A1 | 8/2010 | Zimmerman et al. |
| 2010/0219505 A1 | 9/2010 | D'Evelyn |
| 2010/0220262 A1 | 9/2010 | DeMille et al. |
| 2010/0240158 A1 | 9/2010 | Ter-Hovhannissian |
| 2010/0290208 A1 | 11/2010 | Pickard |
| 2010/0295088 A1 | 11/2010 | D'Evelyn et al. |
| 2010/0309943 A1 | 12/2010 | Chakraborty et al. |
| 2011/0017298 A1 | 1/2011 | Lee |
| 2011/0056429 A1 | 3/2011 | Raring et al. |
| 2011/0062415 A1 | 3/2011 | Ohta et al. |
| 2011/0064103 A1 | 3/2011 | Ohta et al. |
| 2011/0075694 A1 | 3/2011 | Yoshizumi et al. |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0108081 A1 | 5/2011 | Werthen et al. |
| 2011/0121331 A1 | 5/2011 | Simonian et al. |
| 2011/0124139 A1 | 5/2011 | Chang |
| 2011/0175200 A1 | 7/2011 | Yoshida |
| 2011/0177631 A1 | 7/2011 | Gardner et al. |
| 2011/0180781 A1 | 7/2011 | Raring et al. |
| 2011/0182056 A1 | 7/2011 | Trottier et al. |
| 2011/0183498 A1 | 7/2011 | D'Evelyn |
| 2011/0186860 A1 | 8/2011 | Enya et al. |
| 2011/0186874 A1 | 8/2011 | Shum |
| 2011/0216795 A1 | 9/2011 | Hsu et al. |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2011/0266552 A1 | 11/2011 | Tu et al. |
| 2011/0279054 A1 | 11/2011 | Katona et al. |
| 2011/0317397 A1 | 12/2011 | Trottier et al. |
| 2012/0000415 A1 | 1/2012 | D'Evelyn et al. |
| 2012/0007102 A1 | 1/2012 | Feezell et al. |
| 2012/0073494 A1 | 3/2012 | D'Evelyn |
| 2012/0091465 A1 | 4/2012 | Krames et al. |
| 2012/0104412 A1 | 5/2012 | Zhong et al. |
| 2012/0118223 A1 | 5/2012 | D'Evelyn |
| 2012/0135553 A1 | 5/2012 | Felker et al. |
| 2012/0137966 A1 | 6/2012 | D'Evelyn et al. |
| 2012/0178215 A1 | 7/2012 | D'Evelyn |
| 2012/0199841 A1 | 8/2012 | Batres et al. |
| 2012/0199952 A1 | 8/2012 | D'Evelyn et al. |
| 2012/0288974 A1 | 11/2012 | Sharma et al. |
| 2013/0022758 A1 | 1/2013 | Trottier |
| 2013/0026483 A1 | 1/2013 | Sharma et al. |
| 2013/0044782 A1 | 2/2013 | Raring |
| 2013/0112987 A1 | 5/2013 | Fu et al. |
| 2013/0126902 A1 | 5/2013 | Isozaki et al. |
| 2013/0234108 A1 | 9/2013 | David et al. |
| 2014/0103356 A1 | 4/2014 | Krames et al. |

FOREIGN PATENT DOCUMENTS

| | | |
|---|---|---|
| JP | 1997-082587 | 3/1997 |
| JP | 1999-340507 | 12/1999 |
| JP | 1999-340576 | 12/1999 |
| JP | 2001-177146 | 6/2001 |
| JP | 2003-031844 | 1/2003 |
| JP | 2005-289797 | 10/2005 |
| JP | 2007-039321 | 2/2007 |
| JP | 2007-110090 | 4/2007 |
| JP | 2008-084973 | 4/2008 |
| JP | 2008-172040 | 7/2008 |
| WO | WO 2005/121415 | 12/2005 |
| WO | WO 2006/062880 | 6/2006 |
| WO | WO 2007/004495 | 1/2007 |
| WO | WO 2009/001039 | 12/2008 |
| WO | WO 2012/016033 | 2/2012 |

OTHER PUBLICATIONS

Byrappa et al., 'Handbook of Hydrothermal Technology: A Technology for Crystal Growth and Materials Processing', Noyes Publications, Park Ridge, New Jersey, 2001, pp. 94-96 and 152.

Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.

Chiang et al., 'Luminescent Properties of Cerium-Activated Garnet Series Phosphor: Structure and Temperature Effects', Journal of the Electrochemical Society, vol. 155, No. 6, 2008, pp. B517-B520.

Chiu et al., 'Synthesis and Luminescence Properties of Intensely Red-Emitting $M_5Eu(WO_4)_{4-x}(MoO_4)_x$(M=Li, Na, K) Phosphors', Journal of the Electrochemical Society, vol. 155, No. 3, 2008, pp. J71-J78.

Choi et al., '2.51 microcavity InGaN light-emitting diodes fabricated by a selective dry-etch thinning process', Applied Physics Letters, 2007, 91(6), 061120.

Cl et al., '$Ca_{1-x}Mo_{1-y}Si_yO_4$:$Eu_x^{3+}$: A Novel Red Phosphor for White Light Emitting Diodes', Physica B, vol. 403, 2008, pp. 670-674.

Cich et al., 'Bulk GaN based violet light-emitting diodes with high efficiency at very high current density', Applied Physics Letters, Nov. 29, 2012, pp. 223509-1-223509-3.

D'Evelyn et al., 'Bulk GaN Crystal Growth by the High-Pressure Ammonothermal Method', Journal of Crystal Growth, vol. 300, 2007, pp. 11-16.

Dwilinski et al., 'Ammono Method of BN, AlN and GaN Synthesis and Crystal Growth', MRS Internet Journal Nitride Semiconductor Research, vol. 3, No. 25, 1998, pp. 1-5.

Dwilinski et al., 'Excellent Crystallinity of Truly Bulk Ammonothermal GaN', Journal of Crystal Growth, vol. 310, 2008, pp. 3911-3916.

(56) References Cited

OTHER PUBLICATIONS

Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, pp. L761-L763.
Feezell et al., 'AlGaN-Cladding-Free Nonpolar InGaN/GaN Laser Diodes', Japanese Journal of Applied Physics, vol. 46, No. 13, 2007, pp. L284-L286.
Founta et al., 'Anisotropic Morphology of Nonpolar a-Plane GaN Quantum Dots and Quantum Wells', Journal of Applied Physics, vol. 102, vol. 7, 2007, pp. 074304-1-074304-6.
Frayssinet et al., 'Evidence of Free Carrier Concentration Gradient Along the c-Axis for Undoped GaN Single Crystals', Journal of Crystal Growth, vol. 230, 2001, pp. 442-447.
Fukuda et al., 'Prospects for the Ammonothermal Growth of Large GaN Crystal', Journal of Crystal Growth, vol. 305, 2007, pp. 304-310.
Hanifin et al., 'Photoreception for Circadian, Neuroendocrine, and Neurobehavioral Regulation', Journal of Physiological Anthropology, vol. 26, 2007, pp. 87-94.
Happek, 'Development of Efficient UV-LED Phosphor Coatings for Energy Saving Solid State Lighting', University of Georgia, 2007, 22 pages.
Hashimoto et al., 'A GaN bulk crystal with improved structural quality grown by the ammonothermal method', Nature Materials, vol. 6, 2007, pp. 568-671.
Hashimoto et al., 'Ammonothermal Growth of Bulk GaN', Journal of Crystal Growth, vol. 310, 2008, pp. 3907-3910.
Haskell et al., 'Defect Reduction in (1100) m-plane gallium nitride via lateral epitaxial overgrowth by hydride vapor phase epitaxy', Applied Physics Letters 86, 111917 (2005), pp. 1-3.
Hoppe et al., 'Luminescence in Eu2+-Doped Ba2Si5N8: Fluorescence, Thermoliminescence, and Upconversion', Journal of Physics and Chemistry of Solids, vol. 61, 2000, pp. 2001-2006.
Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.
Kim et al., 'High Brightness Light Emitting Diodes Using Dislocation-Free Indium Gallium Nitride/Gallium Nitride Multiquantum—Well Nanorod Arrays', Nano Letters, vol. 4, No. 6, 2004, pp. 1059-1062.
Kim et al, 'Improved Electroluminescence on Nonpolar m-Plane InGaN/GaN Qantum Well LEDs', Rapid Research Letters, vol. 1, No. 3, 2007, pp. 125-127.
Kojima et al., 'Stimulated Emission at 474 nm From an InGaN Laser Diode Structure Grown on a (1122) GaN Substrate', Applied Physics Letters, vol. 91, 2007, pp. 251107-251107-3.
Kolis et al., 'Materials Chemistry and Bulk Crystal Growth of Group III Nitrides in Supercritical Ammonia', Material Resources Society Symposium Proceedings, vol. 495, 1998, pp. 367-372.
Kolis et al., 'Crystal Growth of Gallium Nitride in Supercritical Ammonia', Journal of Crystal Growth, vol. 222, 2001, pp. 431-434.
Kubota et al., 'Temperature Dependence of Polarized Photoluminescence From Nonpolar m-Plane InGaN Multiple Quantum Wells for Blue Laser Diodes', Applied Physics Letter, vol. 92, 2008, pp. 011920-1-011920-3.
Li et al., 'The Effect of Replacement of Sr by Ca OnThe Structural and Luminescence Properties of the Red-Emitting Sr2Si5N8:Eu2+ LED Conversion Phosphor', Journal of Solid State Chemistry, vol. 181, 2007, pp. 515-524.
Lide et al., 'Thermal Conductivity of Ceramics and Other Insulating Materials', CRC Handbook of Chemistry and Physics, 91st Edition, 2010-2011, pp. 12-203 and 12-204.
Lu et al., 'Etch-Pits of GaN Films with Different Etching Methods', Journal of the Korean Physical Society, vol. 45, Dec. 2004, p. S673-S675.
Mastro et al., 'Hydride vapor phase epitaxy-grown AlGaN/GaN high electron mobility tTransistors', Solid-State Electronics, vol. 47, Issue 6, Jun. 2003, pp. 1075-1079.

http://www.matbase.com/material/non-ferrous-metals/other/molybdenum/properties, Data Table for: Non-Ferrous Metals: Other Metals: Molybdenum, Mar. 28, 2011, pp. 1.
Mirwald et al., 'Low-Friction Cell for Piston-Cylinder High Pressure Apparatus', Journal of Geophysical Research, vol. 80, No. 11, 1975, pp. 1519-1525.
Morkoc, 'Handbook of Nitride Semiconductors and Devices', vol. 1, 2008, p. 704.
Motoki et al., 'Growth and Characterization of Freestanding GaN Substrates', Journal of Crystal Growth, vol. 237-239, 2002, pp. 912-921.
Motoki et al., 'Dislocation reduction in GaN crystal by advanced-DEEP', Journal of Crystal Growth, vol. 305, Apr. 1, 2007, pp. 377-383.
Mueller-Mach et al., 'Highly Efficient All-Nitride Phosphor-Converted White Light Emitting Diode', Physica Status Solidi (a), vol. 202, 2005, pp. 1727-1732.
Murota et al., 'Solid State Light Source Fabricated With YAG:Ce Single Crystal', Japanese Journal of Applied Physics, vol. 41, Part 2, No. 8A, 2002, pp. L887-L888.
Okamoto et al., 'Continuous-Wave Operation of m-Plane InGaN Multiple Quantum Well Laser Diodes', Japanese Journal of Applied Physics, vol. 46, No. 9, 2007, pp. L187-L189.
Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, pp. L820- L822.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.
Pattison et al., 'Gallium Nitride Based Microcavity Light Emitting Diodes With 2? Effective Cavity Thickness', Applied Physics Letters, vol. 90, Issue 3, 031111 (2007) 3pg.
International Search Report of PCT Application No. PCT/US2009/048489, dated Sep. 14, 2009, 12 pages total.
International Search Report & Written Opinion of PCT Application No. PCT/US2013/029453, dated Jul. 25, 2013, 11 pages total.
Peters, 'Ammonothermal Synthesis of Aluminium Nitride', Journal of Crystal Growth, vol. 104, 1990, pp. 411-418.
http://www.philipslumileds.com/products/luxeon-flash, 'Luxeon Flash', Philips Lumileds, Aug. 8, 2013, pp. 1-2.
Rea et al., 'White Lighting', COLOR Research and Application, vol. 38, No. 2, Sep. 3, 2011, pp. 82-92.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Sarva et al., 'Dynamic Compressive Strength of Silicon Carbide Under Uniaxial Compression', Material Sciences and Engineering, vol. A317, 2001, pp. 140-144.
Sato et al., 'High Power and High Efficiency Semipolar InGaN Light Emitting Diodes', Journal of Light and Visible Environment, vol. 32, No. 2, Dec. 13, 2007, pp. 57-60.
Sato et al., 'High Power and High Efficiency Green Light Emitting Diode on Free-Standing Semipolar (1122) Bulk GaN Substrate', Physica Status Solidi (RRL), vol. 1, No. 4, 2007, pp. 162-164.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Schmidt et al., 'Demonstration of Nonpolar m-Plane InGaN/GaN Laser Diodes', Japanese Journal of Applied Physics, vol. 46, No. 9, 2007, pp. L190-L191.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
Setlur et al., 'Crystal Chemistry and Luminescence of Ce3+-Doped (Lu2CaMg2(Si,Ge)3O12 and Its Use in LED Based Lighting', Chemistry of Materials, vol. 18, 2006, pp. 3314-3322.

(56) References Cited

OTHER PUBLICATIONS

Sizov et al., '500-nm Optical Gain Anisotropy of Semipolar (1122) InGaN Quantum Wells', Applied Physics Express, vol. 2, 2009, pp. 071001-1-071001-3.
Tsuda et al., 'Blue Laser Diodes Fabricated on m-Plane GaN Substrates', Applied Physics Express, vol. 1, 2008, pp. 011104-1-011104-3.
Tyagi et al., 'Semipolar (1011) InGaN/GaN Laser Diodes on Bulk GaN Substrates', Japanese Journal of Applied Physics, vol. 46, No. 19, 2007, pp. L444-L445.
Communication from the Japanese Patent Office re 2013515583 dated Feb. 27, 2014, (2 pages).
Communication from the Korean Patent Office re 10-2012-7009980 dated Apr. 15, 2013, (6 pages).
Communication from the Japanese Patent Office re 2012-529969, dated Oct. 15, 2013, (6 pages).
Wang et al, 'Ammonothermal Growth of GaN Crystals in Alkaline Solutions', Journal of Crystal Growth, vol. 287, 2006, pp. 376-380.
Wang et al., 'Ammonothermal Synthesis of III-Nitride Crystals', Crystal Growth & Design, vol. 6, No. 6, 2006, pp. 1227-1246.
Wang et al., 'Synthesis of Dense Polycrystaline GaN of High Purity by the Chemical Vapor Reaction Process', Journal of Crystal Growth, vol. 286, 2006, pp. 50-54.
Wang et al., 'New Red Y0.85Bi0.1Eu0.05V1-yMyO4 (M=Nb, P) Phosphors for Light-Emitting Diodes', Physica B, vol. 403, 2008, pp. 2071-2075.
Weaver et al., 'Optical Properties of Selected Elements', Handbook of Chemistry and Physics, 94th Edition, 2013-2014, pp. 12-126-12-150.
Weisbuch et al., 'Recent results and latest views on microcavity LEDs', Light-Emitting Diodes: Research, Manufacturing, and Applications VIII, ed. by S.A. Stockman et al., Proc. SPIE, vol. 5366, p. 1-19 (2004).
Yamamoto, 'White LED Phosphors: The Next Step', Proceeding of SPIE, 2010, pp. 1-10.
Yang et al., 'Preparation and luminescence properties of LED conversion novel phosphors SrZnO2:Sm', Materials Letters, vol. 62, 2008, pp. 907-910.
Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1-233504-3.
Zhong et al., 'Demonstration of High Power Blue-Green Light Emitting Diode on Semipolar (1122) Bulk GaN Substrate', Electronics Letters, vol. 43, No. 15, 2007, pp. 825-826.
USPTO Office Action for U.S. Appl. No. 12/133,364 dated Nov. 26, 2010 (5 pages).
USPTO Office Action for U.S. Appl. No. 12/133,364 dated Jun. 1, 2011 (7 pages).
USPTO Notice of Allowance for U.S. Appl. No. 12/133,364 dated Oct. 11, 2011 (5 pages).
USPTO Office Action for U.S. Appl. No. 12/133,365 dated Jun. 9, 2011 (16 pages).
USPTO Office Action for U.S. Appl. No. 12/133,365 dated Oct. 18, 2011 (21 pages).
USPTO Office Action for U.S. Appl. No. 12/334,418 dated Apr. 5, 2011 (19 pages).
USPTO Office Action for U.S. Appl. No. 12/334,418 dated Oct. 19, 2011 (23 pages).
USPTO Office Action for U.S. Appl. No. 12/478,736 dated Sep. 27, 2011 (10 pages).
USPTO Office Action for U.S. Appl. No. 12/478,736 dated Feb. 7, 2012 (6 pages).
USPTO Notice of Allowance for U.S. Appl. No. 12/478,736 dated Apr. 23, 2012 (7 pages).
USPTO Notice of Allowance for U.S. Appl. No. 12/478,736 dated Oct. 9, 2012 (4 pages).
USPTO Office Action for U.S. Appl. No. 12/481,543 dated Jun. 27, 2011 (9 pages).
USPTO Office Action for U.S. Appl. No. 12/484,095 dated Nov. 10, 2010 (8 pages).
USPTO Office Action for U.S. Appl. No. 12/484,095 dated Jul. 8, 2011 (11 pages).
USPTO Office Action for U.S. Appl. No. 12/491,169 dated Oct. 22, 2010 (9 pages).
USPTO Office Action for U.S. Appl. No. 12/491,169 dated May 11, 2011 (9 pages).
USPTO Office Action for U.S. Appl. No. 12/491,176 dated Mar. 1, 2012 (9 pages).
USPTO Office Action for U.S. Appl. No. 12/497,289 dated Feb. 2, 2012 (6 pages).
USPTO Notice of Allowance for U.S. Appl. No. 12/497,289 dated May 22, 2012 (7 pages).
USPTO Office Action for U.S. Appl. No. 12/497,969 dated Feb. 2, 2012 (19 pages).
USPTO Office Action for U.S. Appl. No. 12/497,969 dated Jul. 5, 2012 (17 pages).
USPTO Office Action for U.S. Appl. No. 12/534,838 dated May 3, 2011 (11 pages).
USPTO Office Action for U.S. Appl. No. 12/534,838 dated Jan. 13, 2012 (12 pages).
USPTO Office Action for U.S. Appl. No. 12/534,838 dated Mar. 20, 2012 (12 pages).
USPTO Notice of Allowance for U.S. Appl. No. 12/534,838 dated Jun. 8, 2012 (8 pages).
USPTO Office Action for U.S. Appl. No. 12/534,843 dated Sep. 10, 2012 (9 pages).
USPTO Office Action for U.S. Appl. No. 12/534,844 dated Sep. 16, 2010 (8 pages).
USPTO Office Action for U.S. Appl. No. 12/534,844 dated Feb. 4, 2011 (9 pages).
USPTO Notice of Allowance for U.S. Appl. No. 12/534,849 dated Jul. 31, 2012 (11 pages).
USPTO Office Action for U.S. Appl. No. 12/534,857 dated Sep. 1, 2010 (10 pages).
USPTO Notice of Allowance for U.S. Appl. No. 12/534,857 dated May 27, 2011 (5 pages).
USPTO Office Action for U.S. Appl. No. 12/546,458 dated Jul. 20, 2011 (4 pages).
USPTO Notice of Allowance for U.S. Appl. No. 12/546,458 dated Nov. 28, 2011 (5 pages).
USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (5 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (18 pages).
USPTO Notice of Allowance for U.S. Appl. No. 12/569,337 dated Nov. 15, 2012 (5 pages).
USPTO Office Action for U.S. Appl. No. 12/569,841 dated Dec. 23, 2011 (12 pages).
USPTO Office Action for U.S. Appl. No. 12/569,841 dated Mar. 26, 2013 (17 pages).
USPTO Office Action for U.S. Appl. No. 12/569,841 dated Aug. 13, 2013 (20 pages).
USPTO Office Action for U.S. Appl. No. 12/569,841 dated Feb. 14, 2014 (20 pages).
USPTO Office Action for U.S Appl. No. 12/569,844 dated Oct. 12, 2012 (12 pages).
USPTO Notice of Allowance for U.S. Appl. No. 12/569,844 dated Mar. 7, 2013 (9 pages).
USPTO Office Action for U.S. Appl. No. 12/634,665 dated Apr. 25, 2012 (10 pages).
USPTO Office Action for U.S. Appl. No. 12/634,665 dated Oct. 1, 2012 (10 pages).

(56) References Cited

OTHER PUBLICATIONS

USPTO Office Action for U.S. Appl. No. 12/634,665 dated Mar. 12, 2012 (9 pages).
USPTO Notice of Allowance for U.S. Appl. No. 12/720,593 dated Jul. 11, 2012 (7 pages).
USPTO Office Action for U.S. Appl. No. 12/724,983 dated Mar. 5, 2012 (20 pages).
USPTO Office Action for U.S. Appl. No. 12/749,466 dated Jul. 3, 2012 (18 pages).
USPTO Office Action for U.S. Appl. No. 12/749,476 dated Apr. 11, 2011 (14 pages).
USPTO Office Action for U.S. Appl. No. 12/749,476 dated Nov. 8, 2011 (11 pages).
USPTO Notice of Allowance for U.S. Appl. No. 12/749,476 dated May 4, 2012 (8 pages).
USPTO Notice of Allowance for U.S. Appl. No. 12/749,476 dated Jun. 26, 2012 (8 pages).
USPTO Notice of Allowance for U.S. Appl. No. 12/754,886 dated May 17, 2012 (19 pages).
USPTO Notice of Allowance for U.S. Appl. No. 12/754,886 dated Jun. 5, 2012 (16 pages).
USPTO Notice of Allowance for U.S. Appl. No. 12/754,886 dated Jun. 20, 2012 (14 pages).
USPTO Office Action for U.S. Appl. No. 12/785,404 dated Mar. 6, 2012 (9 pages).
USPTO Notice of Allowance for U.S. Appl. No. 12/785,404 dated Jul. 16, 2012 (5 pages).
USPTO Office Action for U.S. Appl. No. 12/785,953 dated Apr. 12, 2012 (11 pages).
USPTO Office Action for U.S. Appl. No. 12/785,953 dated Jan. 11, 2013 (14 pages).
USPTO Office Action for U.S. Appl. No. 12/785,953 dated Oct. 3, 2013 (10 pages).
USPTO Notice of Allowance for U.S. Appl. No. 12/785,953 dated Mar. 20, 2014 (8 pages).
USPTO Office Action for U.S. Appl. No. 12/861,765 dated Jul. 2, 2012 (11 pages).
USPTO Office Action for U.S. Appl. No. 12/861,765 dated Mar. 7, 2013 (12 pages).
USPTO Office Action for U.S. Appl. No. 12/861,765 dated Sep. 17, 2013 (10 pages).
USPTO Office Action for U.S. Appl. No. 12/861,765 dated Mar. 28, 2014 (12 pages).
USPTO Office Action for U.S. Appl. No. 12/879,784 dated Jan. 25, 2012 (6 pages).
USPTO Notice of Allowance for U.S. Appl. No. 12/879,784 dated Apr. 3, 2012 (7 pages).
USPTO Office Action for U.S. Appl. No. 12/880,803 dated Feb. 22, 2012 (8 pages).
USPTO Notice of Allowance for U.S. Appl. No. 12/880,803 dated Jul. 18, 2012 (5 pages).
USPTO Office Action for U.S. Appl. No. 12/880,889 dated Feb. 27, 2012 (12 pages).
USPTO Office Action for U.S. Appl. No. 12/880,889 dated Sep. 19, 2012 (12 pages).
USPTO Office Action for U.S. Appl. No. 12/891,668 dated Sep. 25, 2012 (20 pages).
USPTO Office Action for U.S. Appl. No. 12/936,238 dated Aug. 30, 2012 (11 pages).
USPTO Office Action for U.S. Appl. No. 12/936,238 dated Jan. 30, 2013 (12 pages).
USPTO Notice of Allowance for U.S. Appl. No. 12/936,238 dated Apr. 16, 2013 (9 pages).
USPTO Office Action for U.S. Appl. No. 12/995,946 dated Mar. 28, 2012 (17 pages).
USPTO Office Action for U.S. Appl. No. 12/995,946 dated Jan. 29, 2013 (25 pages).
USPTO Office Action for U.S. Appl. No. 12/995,946 dated Aug. 2, 2013 (15 pages).
USPTO Office Action for U.S. Appl. No. 13/012,674 dated Jan. 17, 2014 (15 pages).
USPTO Notice of Allowance for U.S. Appl. No. 13/012,674 dated Apr. 30, 2014 (8 pages).
USPTO Office Action for U.S. Appl. No. 13/014,622 dated Nov. 28, 2011 (13 pages).
USPTO Office Action for U.S. Appl. No. 13/014,622 dated Apr. 30, 2012 (13 pages).
USPTO Office Action for U.S. Appl. No. 13/014,622 dated Jun. 20, 2014 (15 pages).
USPTO Office Action for U.S. Appl. No. 13/019,897 dated Mar. 30, 2012 (14 pages).
USPTO Office Action for U.S. Appl. No. 13/019,897 dated Jan. 16, 2013 (7 pages).
USPTO Office Action for U.S. Appl. No. 13/019,897 dated Dec. 2, 2013 (17 pages).
USPTO Office Action for U.S. Appl. No. 13/019,897 dated Jun. 12, 2014 (8 pages).
USPTO Office Action for U.S. Appl. No. 13/025,833 dated Jul. 12, 2012 (15 pages).
USPTO Office Action for U.S. Appl. No. 13/041,199 dated Nov. 30, 2012 (13 pages).
USPTO Notice of Allowance for U.S. Appl. No. 13/163,482 dated Jul. 31, 2012 (5 pages).
USPTO Office Action for U.S. Appl. No. 13/175,739 dated Dec. 7, 2012 (5 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/226,249 dated Oct. 10, 2012 (7 pages).
USPTO Office Action for U.S. Appl. No. 13/281,221 dated Jun. 21, 2013 (6 pages).
USPTO Notice of Allowance for U.S. Appl. No. 13/281,221 dated Nov. 12, 2013 (10 pages).
USPTO Office Action for U.S. Appl. No. 13/304,182 dated May 9, 2014 (12 pages).
USPTO Notice of Allowance for U.S. Appl. No. 13/304,182 dated Aug. 27, 2014 (8 pages).
USPTO Office Action for U.S. Appl. No. 13/328,978 dated May 15, 2013 (24 pages).
USPTO Office Action for U.S. Appl. No. 13/328,978 dated Sep. 26, 2013 (25 pages).
USPTO Office Action for U.S. Appl. No. 13/357,578 dated May 13, 2014 (8 pages).
USPTO Notice of Allowance for U.S. Appl. No. 13/425,304 dated Aug. 22, 2012 (7 pages).
USPTO Office Action for U.S. Appl. No. 13/465,976 dated Aug. 16, 2012 (16 pages).
USPTO Office Action for U.S. Appl. No. 13/465,976 dated Dec. 20, 2012 (16 pages).
USPTO Office Action for U.S. Appl. No. 13/465,976 dated Aug. 25, 2014 (21 pages).
USPTO Office Action for U.S. Appl. No. 13/548,635 dated Jun. 14, 2013 (5 pages).
USPTO Notice of Allowance for U.S. Appl. No. 13/548,635 dated Sep. 16, 2013 (6 pages).
USPTO Office Action for U.S. Appl. No. 13/548,770 dated Mar. 12, 2013 (5 pages).
USPTO Notice of Allowance for U.S. Appl. No. 13/548,770 dated Jun. 25, 2013 (6 pages).
USPTO Office Action for U.S. Appl. No. 13/553,691 dated Sep. 17, 2014 (14 pages).
USPTO Office Action for U.S. Appl. No. 13/629,366 dated Oct. 31, 2013 (7 pages).
USPTO Office Action for U.S. Appl. No. 13/629,366 dated Apr. 18, 2014 (7 pages).
USPTO Office Action for U.S. Appl. No. 13/723,968 dated Nov. 29, 2013 (23 pages).
USPTO Office Action for U.S. Appl. No. 14/054,234 dated Aug. 14, 2014 (24 pages).

* cited by examiner

Square Pitch: Vertical Structure

Square Pitch: Lateral Structure

Hexagonal Pitch:

Hexagonal Pitch:

GALLIUM—NITRIDE-ON-HANDLE SUBSTRATE MATERIALS AND DEVICES AND METHOD OF MANUFACTURE

This application is a continuation of U.S. application Ser. No. 13/012,674, filed on Jan. 24, 2011, now allowed, which is incorporated by reference in its entirety.

BACKGROUND OF THE INVENTION

This invention generally relates to manufacture of materials and devices. More particularly, the present invention provides a method and device using wafer-bonded crystals or the like in combination with optical devices composed of a gallium-containing nitride crystal. More specifically, embodiments of the invention include techniques for fabricating a light emitting diode device using bulk gallium nitride containing materials, for example for application to optoelectronic devices. In other embodiments, the invention provides a method of manufacture using an epitaxial gallium containing crystal with a release layer. Such crystals and materials include GaN, AlN, InN, InGaN, AlGaN, and AlInGaN, and others, for manufacture of bulk or patterned substrates.

Progress has been made during the past decade and a half in the performance of gallium nitride (GaN) based light emitting diodes (LEDs). Devices with a luminous efficiency higher than 100 lumens per watt have been demonstrated in the laboratory, and commercial devices have an efficiency that is already superior to that of incandescent lamps, and competitive with that of fluorescent lamps. Further improvements in efficiency are desired to reduce operating costs, reduce electricity consumption, and decrease emissions of carbon dioxide and other greenhouse gases produced in generating the energy used for lighting applications.

Silicon-on-insulator substrates are well known in the art, and convey certain advantages compared to standard silicon substrates. Several authors have demonstrated GaN-on-insulator substrates. Tauzin et al. [Electronics Letters 41, 668 (2005) transferred the topmost portion from a 4-µm-thick GaN-on-sapphire epilayer onto a second sapphire substrate by means of SmartCut™ layer-transfer technology. The crystalline quality of the transferred layer was not particularly high in this case. O. Moutanabbir and U. Gösele [J. Electronic Mater. 39, 482 (2010)] transferred a layer from a free-standing, pseudo-bulk GaN wafer of unspecified quality to sapphire. Sapphire, while readily available and convenient to work with, suffers from a relatively low thermal conductivity and has a significant mismatch in the coefficient of thermal expansion with respect to the GaN layer. In addition, in cases where the nitride crystal in a GaN-on-insulator wafer is spatially inhomogeneous, we are not aware of any teachings about the best way to arrange fabricated devices with respect to structures in the GaN layer.

What is needed is a more manufacturable solution for fabricating high-quality GaN-on-handle substrates or wafers that are optimized for down-stream device processing and device designs and processing methods that are optimized to take advantage of the properties of the wafer.

BRIEF SUMMARY OF THE INVENTION

In a specific embodiment, the present invention provides a gallium and nitrogen containing optical device. The device includes a handle substrate member portion having a surface region. The handle substrate portion is characterized by a first coefficient of thermal expansion parallel to the surface. The device has an adhesion material (e.g., dielectric, conductor) overlying the surface region. The device also has a gallium and nitrogen containing region formed overlying the adhesion material. The gallium and nitrogen containing region is characterized by a second coefficient of thermal expansion parallel to the surface. The second coefficient of thermal expansion is substantially similar to the first coefficient of thermal expansion. The gallium and nitrogen containing region is formed from a donor gallium and nitrogen containing material transferred to the handle substrate. The device also includes at least one active region formed overlying the gallium and nitrogen containing region and at least one p-type region formed epitaxially overlying the active region.

In an alternative specific embodiment, the present invention provides a gallium and nitrogen containing device. The device includes a handle substrate member having a first surface region and a second surface region and at least one n-contact region overlying the first surface region. The device has a gallium and nitrogen containing material overlying the second region. The gallium and nitrogen containing material is transferred overlying the second region. The gallium and nitrogen containing material includes a core region. As used herein, the core region refers to a commonly known entity of a dot core GaN substrate from Sumitomo Electric Industries, Ltd, of Japan, or others. The device has an interface region overlying the gallium and nitrogen containing material and at least one n-type epitaxial growth region overlying the interface region. The device also has a core structure extending from the core region within the overlying gallium and nitrogen containing material and configured to extend through the at least one n-type epitaxial growth region. The device has an active region overlying the at least one n-type epitaxial growth region, a p-type region overlying the first active region and the second active region, and at least one p-contact region overlying the p-type region. As an example, the dot core GaN is described in "Dislocation reduction in GaN crystal by advanced-DEEP," in the names of Motoki, et al., and published in Journal of Crystal Growth 305 (2007) 377-383, which is incorporated by reference herein.

In other embodiments, the invention provides a gallium and nitrogen containing device. The device has a handle substrate member having a first surface region, with gallium and nitrogen containing material overlying the first region. The gallium and nitrogen containing material is transferred overlying the first region. The gallium and nitrogen containing material comprises a core region. The device has an interface region overlying the gallium and nitrogen containing material and at least one n-type epitaxial growth region overlying the interface region. The device has a core structure extending from the core region within the overlying gallium and nitrogen containing material and configured to extend through the at least one n-type epitaxial growth region. The device has an active region overlying the at least one n-type epitaxial growth region and a p-type region overlying the first active region and the second active region. The device has a mesa structure, wherein material lateral to at least one mesa has been removed so as to expose at least one n-type epitaxial growth region. The device has at least one n-contact region overlying the exposed n-type region and at least one p-contact region overlying the p-type region.

Still further, the invention provides a method of processing a gallium and nitrogen containing material. The method includes providing a handle substrate having a surface region. The method includes transferring a thickness of gallium and nitrogen containing substrate material comprising at least one core region therein overlying the surface region. The device has depositing a gallium and nitrogen containing material using at least epitaxial growth overlying the thickness of gallium and nitrogen containing substrate material to form a thickness of epitaxially grown material comprising a core structure formed overlying the core region. The method includes subjecting the core structure to at least an etching process.

Moreover, the invention provides a gallium and nitrogen containing device. The device has a handle substrate member having a first surface region and a second surface region. The handle substrate member is conductive in characteristic and an exposed region characterizing the first surface region. The device has a gallium and nitrogen containing material overlying the second surface region. The gallium and nitrogen containing material is transferred overlying the second region. The gallium and nitrogen containing material comprises a core region. The device has an interface region overlying the gallium and nitrogen containing material. The device has at least one n-type epitaxial growth region overlying the interface region and a conductive structure extending from the core region and configured through portion between the two n-type epitaxial growth regions. The device has an active region formed overlying the n-type epitaxial growth region and a p-type region formed overlying the active region. The device has an n-type contact region formed overlying the conductive structure.

Still further, the present invention provides a gallium and nitrogen containing substrate structure. The structure includes a handle substrate member having a first surface and a second surface and a transferred thickness of gallium and nitrogen material. The structure has a gallium and nitrogen containing active region grown overlying the transferred thickness of gallium and nitrogen containing material and a recessed region formed within a portion of the handle substrate member. The substrate structure has a conductive material formed within the recessed region and is configured to transfer thermal energy from at least the transferred thickness of gallium and nitrogen material.

Still further, the present invention provides a gallium and nitrogen containing substrate structure. The substrate structure includes a handle substrate member having a first surface and a second surface and comprising a plurality of energy conversion materials and a transferred thickness of gallium and nitrogen material. The substrate structure includes a gallium and nitrogen containing active region grown overlying the transferred thickness of gallium and nitrogen containing material.

The present device and method provides for an improved gallium and nitrogen containing material and resulting device structures for optical and electronic devices. In other embodiments, the present method and resulting structure are easier to implement using conventional technologies. The invention provides a high quality GaN substrate and resulting devices. These and other benefits are further described below in conjunction with the attached drawings.

DETAILED DESCRIPTION OF THE INVENTION

Figure 1:
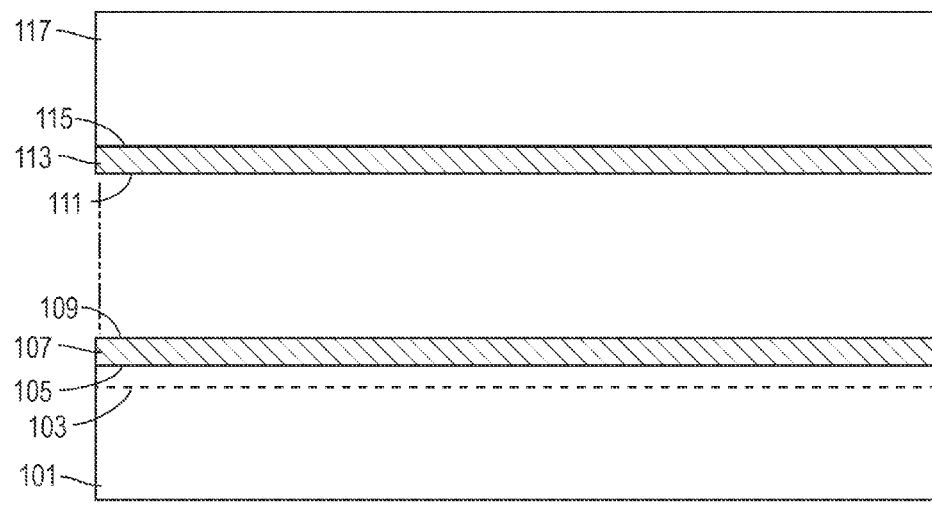
FIG. 1 is a diagram of a nitride crystal and a handle substrate according to an embodiment of the present invention.

Referring to FIG. 1, in one set of embodiments the starting point for the present invention is a donor substrate 101 consisting essentially of a high quality nitride crystal or wafer. The nitride crystal comprises nitrogen and has a threading dislocation density below about $10^8$ cm$^{-2}$. The nitride crystal or wafer may comprise $Al_xIn_yGa_{1-x-y}N$, where $0 \leq x, y, x+y \leq 1$, for example, GaN. In a preferred embodiment, the nitride crystal is substantially free of low-angle grain boundaries, or tilt boundaries, over a length scale of at least 3 millimeters.

The nitride crystal or wafer may have a large-surface orientation within ten degrees, within five degrees, within two degrees, within one degree, within 0.5 degree, or within 0.2 degree of (0 0 0 1), (0 0 0 -1), {1 -1 0 0}, {1 1 -2 0}, {1 -1 0 ±1}, {1 -1 0 ±2}, {1 -1 0 ±3}, {2 0 -2 ±1}, or {1 1 -2 ±2}.

In one specific embodiment, the nitride crystal has a semipolar large-surface orientation, which may be designated by (hkil) Bravais-Miller indices, where i=−(h+k), l is nonzero and at least one of h and k are nonzero. The nitride crystal may have a dislocation density below $10^7$ cm$^{-2}$, below $10^6$ cm$^{-2}$, below $10^5$ cm$^{-2}$, below $10^4$ cm$^{-2}$, below $10^3$ cm$^{-2}$, or below $10^2$ cm$^{-2}$. The nitride crystal may have a stacking-fault concentration below $10^3$ cm$^{-1}$, below $10^2$ cm$^{-1}$, below 10 cm$^{-1}$ or below 1 cm$^{-1}$. The nitride crystal or wafer may have an optical absorption coefficient below 100 cm$^{-1}$, below 50 cm$^{-1}$, below 5 cm$^{-1}$, below 2 cm$^{-1}$, below 1 cm$^{-1}$, or below 0.3 cm$^{-1}$ at wavelengths between about 390 nm and about 700 nm. The nitride crystal may have an optical absorption coefficient below 100 cm$^{-1}$, below 50 cm$^{-1}$, below 5 cm$^{-1}$, below 2 cm$^{-1}$, below 1 cm$^{-1}$, or below 0.3 cm$^{-1}$ at wavelengths between about 700 nm and about 3077 nm and at wavelengths between about 3333 nm and about 6667 nm. The top surface of the nitride crystal may have an x-ray diffraction w-scan rocking curve full-width-at-half-maximum (FWHM) less than about 300 arc sec, less than about 200 arc sec, less than about 100 arc sec, less than about 50 arcsec, less than about 40 arcsec, less than about 30 arcsec, less than about 20 arcsec, or less than about 10 arcsec for the lowest-order symmetric and non-symmetric reflections. In some embodiments, the threading dislocations in the top surface of the nitride crystal are approximately uniformly distributed. In other embodiments, the threading dislocations in the top surface of the nitride crystal are arranged inhomogeneously as a one-dimensional array of rows of relatively high- and relatively low-concentration regions or as a two-dimensional array of high-dislocation-density regions within a matrix of low-dislocation-density regions. The relatively high-dislocation-density regions in a two-dimensional array may be referred to as cores or core regions and the nitride crystal may be referred to as a dot-core crystal or substrate.

Nitride crystal 101 may have a crystallographic radius of curvature greater than 0.1 meter, greater than 1 meter, greater than 10 meters, greater than 100 meters, or greater than 1000 meters, in at least one, at least two, or in three independent or orthogonal directions. Nitride crystal 101 may comprise regions having a relatively high concentration of threading dislocations separated by regions having a relatively low concentration of threading dislocations. The concentration of threading dislocations in the relatively high concentration regions may be greater than about $10^6$ cm$^{-2}$, greater than about $10^7$ cm$^{-2}$, or greater than about $10^8$ cm$^{-2}$. The concentration of threading dislocations in the relatively low concentration regions may be less than about $10^6$ cm$^{-2}$, less than about $10^5$ cm$^{-2}$, or less than about $10^4$ cm$^{-2}$. Nitride crystal 101 may have a thickness between about 100 microns and about 100 millimeters, or between about 1 millimeter and about 10 millimeters. Nitride crystal 101 may have a diameter of at least about 0.5 millimeter, at least about 1 millimeter, at least about 2 millimeters, at least about 5 millimeters, at least about 10 millimeters, at least about 15 millimeters, at least about 20 millimeters, at least about 25 millimeters, at least about 35 millimeters, at least about 50 millimeters, at least about 75 millimeters, at least about 100 millimeters, at least about 150 millimeters, or at least about 200 millimeters. The crystallographic orientation may be constant to less than about 2 degrees, less than about 1 degree, less than about 0.5 degree, less than about 0.2 degree, less than about 0.1 degree, or less than about 0.05 degree across the top surface of the nitride crystal.

The nitride crystal may be fabricated by hydride vapor phase epitaxy (HVPE), as described in U.S. Pat. No. 6,468,347, in US Patent Application US 2006/0228870A1, or by Fujito et al., J. Cryst. Growth, 311, 3011 (2009), by ammonothermal growth, as described in U.S. Pat. Nos. 6,656,615, 7,078,731, and 7,642,122, US Patent Application 2010/0031875, or U.S. patent application Ser. Nos. 12/988,772, 61/360,819, or 61/386,879, or by flux growth, as described by M. Imade et al., Applied Physics Express 3, 075501 (2010), each of which is hereby incorporated by reference in its entirety. In some embodiments the nitride crystal is doped, for example, with Si or O to form n-type material, with a dopant concentration between about $10^{17}$ cm$^{-3}$ and $10^{20}$ cm$^{-3}$.

Referring again to FIG. 1, in one set of embodiments surface 105 of nitride crystal 101 is implanted with ions, forming an implanted/damaged region 103 according to methods that are known in the art. The ion implantation may be performed with at least one of H$^+$, H$_2^+$, He$^+$, Ne$^+$, Ar$^+$, Kr$^+$, Xe$^+$, N$^+$, or N$_2^+$. The implantation energy be between about 10 keV and about 10 MeV, or preferably between about 20 keV and about 2 MeV. The ion fluence or dose may be between about $10^{16}$ cm$^{-2}$ and about $10^{19}$ cm$^{-2}$, between about $10^{17}$ cm$^{-2}$ and about $10^{18}$ cm$^{-2}$, or between about $2\times10^{17}$ cm$^{-2}$ and about $4\times10^{17}$ cm$^{-2}$. In some embodiments, the back side of crystal 101 is also implanted with ions, forming a second implanted/damaged region (not shown), with a similar ion composition, energy, and fluence, so as to minimize bow in crystal 101, as described by O. Moutanabbir and U. Gösele, J. Electronic Mater. 39, 482 (2010), which is hereby incorporated by reference in its entirety Referring again to FIG. 1, a handle substrate 117 having surface 115 is also provided. Handle substrate 117 may comprise a single crystal, polycrystalline or amorphous material. Handle substrate 117 may comprise sapphire, aluminum oxide, mullite, silicon, silicon nitride, germanium, gallium arsenide, silicon carbide, MgAl$_2$O$_4$ spinel, zinc oxide, indium tin oxide (ITO), indium oxide, tin oxide, indium phosphide, beryllium oxide, chemical-vapor-deposition (CVD) diamond, single crystal diamond, YAG:Ce, gallium nitride, indium nitride, gallium aluminum indium nitride, aluminum oxynitride, or aluminum nitride. Other materials comprising transparent phosphors are described in U.S. Provisional Application No. 61/167,447 filed Apr. 7, 2009, commonly assigned, and hereby incorporated by reference herein. Handle substrate 117 may comprise an electrical insulator, a conducting oxide, a conducting transparent oxide, a luminescent material, a distributed bragg reflector (DBR) stack, a band-pass or an edge-pass filter stack, a semiconductor, a semimetal, or a metal. Handle substrate 117 may comprise substantially the same composition as crystal 101. In one specific embodiment, handle substrate 117 comprises crystals that have been merged or tiled together using another method. For example, handle substrate 117 may be formed using at least one of the tiling methods disclosed by Dwilinski et al. [US Patent Application No. 2008/0156254] or the method disclosed in U.S. patent application Ser. No. 12/635, 645, which is hereby incorporated by reference in its entirety.

In one specific embodiment, handle substrate 117 comprises substantially the same composition as crystal 101 and has a crystallographic orientation within about 10 degrees, within about 5 degrees, within about 2 degrees, or within about 1 degree of that of crystal 101. Handle substrate 117 may comprise a glass, a glass-ceramic, or a ceramic. Handle substrate 117 may comprise an oxide of at least one of Si, Ge, Sn, Pb, B, Al, Ga, In, Tl, P, As, Sb, Pb, Li, Na, K, Rb, Cs, Mg, Ca, Sr, Ba, Y, Ti, Zr, Hf, Mn, Zn, or Cd. In one specific embodiment, handle substrate 117 comprises oxygen-doped aluminum nitride. Handle substrate 117 may have a thermal expansion coefficient parallel to surface 115 between room temperature and about 700 degrees Celsius that is between about $2.5 \times 10^{-6}$ K$^{-1}$ and about $7 \times 10^{-6}$ K$^{-1}$. Handle substrate 117 may have a thermal expansion coefficient parallel to surface 115 between room temperature and about 700 degrees Celsius that is between about $5.5 \times 10^{-6}$ K$^{-1}$ and about $6.5 \times 10^{-6}$ K$^{-1}$. Handle substrate 117 may have a thermal expansion coefficient parallel to surface 115 between room temperature and about 700 degrees Celsius that within about 20%, within about 10% within about 5%, within about 2%, or within about 1% of that of nitride crystal 101. Handle substrate 117 may have a softening point, that is, where its viscosity has a value of about $10^8$ Poise, at a temperature between about 500 degrees Celsius and about 1400 degrees Celsius. Handle substrate 117 may have a glass transition temperature between about 600 degrees Celsius and about 1200 degrees Celsius. Handle substrate 117 may have a softening point, that is, where its viscosity has a value of about $10^8$ Poise, at a temperature between about 600 degrees Celsius and about 900 degrees Celsius. Surface 115 may be optically flat, with a deviation from flatness less than 1 micron, less than 0.5 micron, less than 0.2 micron, less than 0.1 micron, or less than 0.05 micron. Surface 115 may be very smooth, with a root-mean-square roughness less than 5 nanometers, less than 2 nanometers, less than 1 nanometer, less than 0.5 nanometer, less than 0.2 nanometer, less than 0.1 nanometer, or less than 0.05 nanometer, measured over an area of at least 10 microns×10 microns. Handle substrate 117 may be substantially transparent at visible wavelengths of light, such that one of ordinary skill in the art may be able to read printed words through handle substrate 117.

Adhesion layers 113 and 107 may be deposited on at least one of surface 115 of handle substrate 117 and surface 105 of donor substrate 101. Adhesion layers 113 and 107 may comprise at least one of $SiO_x$, $GeO_x$, $SiN_x$, $AlN_x$, $GaO_x$, $Al_2O_3$, $Sc_2O_3$, $Y_2O_3$, $B_2O_3$, $R_2O_3$, where R is a rare earth element, MgO, CaO, SrO, $HfO_2$, $ZrO_2$, $Ta_2O_5$, or B, Al, Si, P, Zn, Ga, Si, Ge, Au, Ag, Ni, Ti, Cr, Zn, Cd, In, Sn, Sb, Tl, or Pb, or an oxide, nitride, or oxynitride thereof. Adhesion layers 113 and/or 107 may be electrically insulating. Adhesion layers 113 and 107 may further comprise hydrogen. The adhesion layers 113 and 107 may be deposited by thermal evaporation, electron-beam evaporation, sputtering, chemical vapor deposition, plasma-enhanced chemical vapor deposition, or the like, or by thermal oxidation of a deposited metallic film. The thickness of adhesion layers 113 and 107 may between about 1 nanometer and about 10 microns, or between about 10 nanometers and about 1 micron. The adhesion layer(s) may be annealed, for example, to a temperature between about 300 degrees Celsius and about 1000 degrees Celsius. In some embodiments, at least one adhesion layer is chemical-mechanically polished. In a preferred embodiment, the root-mean-square surface roughness of at least one adhesion layer is below about 0.5 nanometer, or below about 0.3 nanometer over a 20×20 μm² area.

Figure 2:
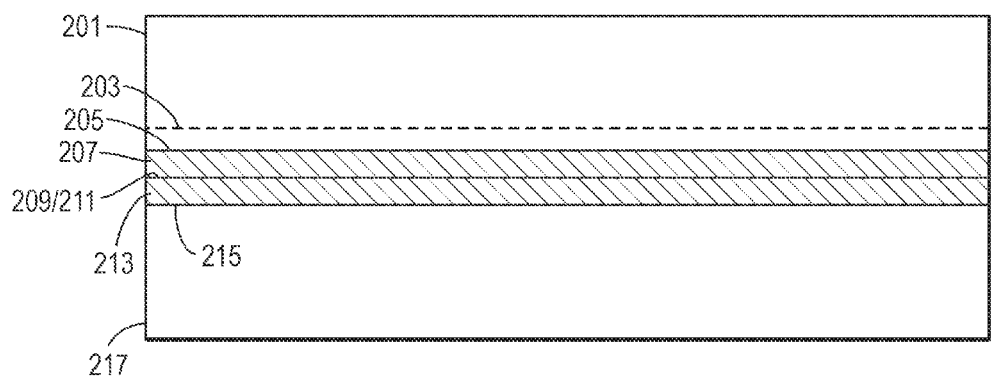
FIG. 2 is a diagram of a wafer-bonded nitride crystal and handle substrate according to an embodiment of the present invention.

Referring again to FIG. 1 and also to FIG. 2, surfaces 109/209 of nitride crystal 101/201 or adhesion layer placed thereupon and surface 111/211 of handle substrate 117/217 or adhesion layer placed thereupon are placed in contract with one another and wafer-bonded. In a preferred embodiment, the wafer bonding operation is performed in a clean room, with less than 10,000, less than 1,000, less than 100, or less than 10 particles per cubic centimeter in the air. Particles may be removed from at least one of the surfaces immediately prior to wafer bonding by spraying, brushing, or rinsing with ionized nitrogen, a $CO_2$ jet, $CO_2$ snow, high-resistivity water, an organic solvent, such as methanol, ethanol, isopropanol, acetone, or the like. In some embodiments, surface 109/209 and surface 111/211 are brought into contact while immersed in a liquid. Optionally, at least one of the surfaces is exposed to a plasma to enhance wafer bonding.

Nitride crystal 101 may be pressed against handle substrate 117 with a pressure between about 0.1 megapascals and about 100 megapascals. In some embodiments, van der Waals forces are sufficient to obtain a good wafer bond and no additional applied force is necessary. Nitride crystal 101 and handle substrate 117 may be heated to a temperature between about 30 degrees Celsius and about 950 degrees Celsius, between about 30 degrees Celsius and about 400 degrees Celsius, or between about 30 degrees Celsius and about 200 degrees Celsius for a period between about 5 minutes and about 10 hours to strengthen the wafer bond. In some embodiments, heating of nitride crystal 101 and handle substrate 113 is performed while they are mechanically loaded against one another.

Figure 3:
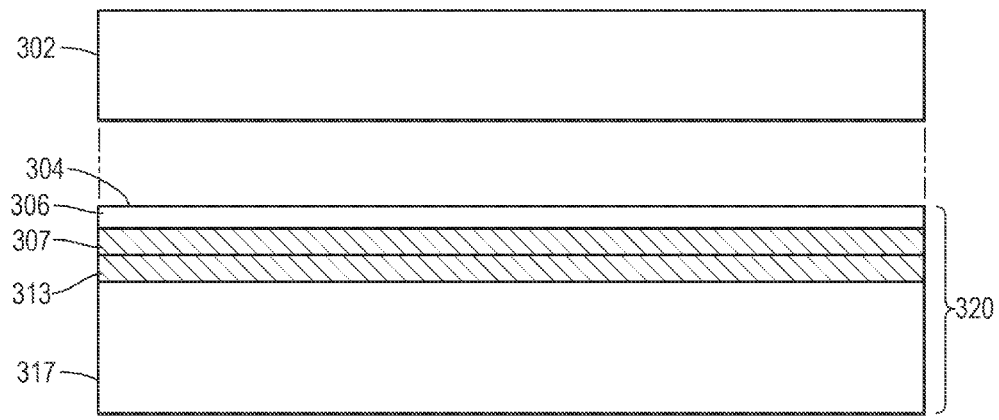
FIG. 3 is a diagram of a wafer-bonded nitride crystal and handle substrate after removal of portion of the nitride crystal according to an embodiment of the present invention.

Referring again to FIG. 2 and to FIG. 3, in some embodiments, at least the surface region of bonded nitride crystal 201 having implanted/damaged region 203 and handle substrate 217/317 are heated to a temperature between about 200 degrees Celsius and about 800 degrees Celsius or between about 500 degrees Celsius and about 700 degrees Celsius to cause micro-bubbles, micro-cracks, micro-blisters, or other mechanical flaws within region 203. In one specific embodiment, surface region 306 is heated by means of optical or infrared radiation through handle substrate 217/317, and the distal portion 302 of crystal 201 may remain less than about 300 degrees Celsius, less than about 200 degrees Celsius, or less than about 100 degrees Celsius. In some embodiments, mechanical energy may be provided instead of or in addition to thermal energy. In some embodiments, an energy source such as a pressurized fluid is directed to a selected region, such as an edge, of bonded nitride crystal 201 to initiate a controlled cleaving action within region 203. After the application of energy, the distal portion 302 of nitride crystal 201 is removed, leaving a proximate portion 306 of nitride crystal 101 bonded to handle substrate 217/317.

In one set of embodiments, a release layer and a high quality epitaxial layer are functionally substituted for the ion-damaged layer, as described in U.S. Patent Application Ser. No. 61/386,879. The high quality epitaxial layer may be wafer-bonded to the handle substrate and may be separated from the nitride crystal by means of laser lift-off, preferential etching, photochemical etching, photoelectrochemical etching, or the like.

Referring again to FIG. 3, the newly exposed surface 304 of transferred layer 306 on GaN-on-handle wafer 320 may be polished, dry-etched, or chemical-mechanically polished according to methods that are known in the art to prepare an epi-ready surface.

In some embodiments, GaN-on-handle wafer 320 is used as a substrate for epitaxy. One or more edges of the wafer may be ground. The wafer may be placed in a suitable reactor and at least one epitaxial layer grown by MOCVD, MBE, HVPE, or the like. In a preferred embodiment, the epitaxial layer comprises GaN or $Al_xIn_yGa_{(1-x-y)}N$, where $0 \le x$, $y \le 1$.

The GaN-on-handle wafer may be used as a substrate for fabrication into optoelectronic and electronic devices such as at least one of a light emitting diode (LED), a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation. Optionally, one or more devices may be flip-chip bonded for improved heat extraction.

Figure 4:
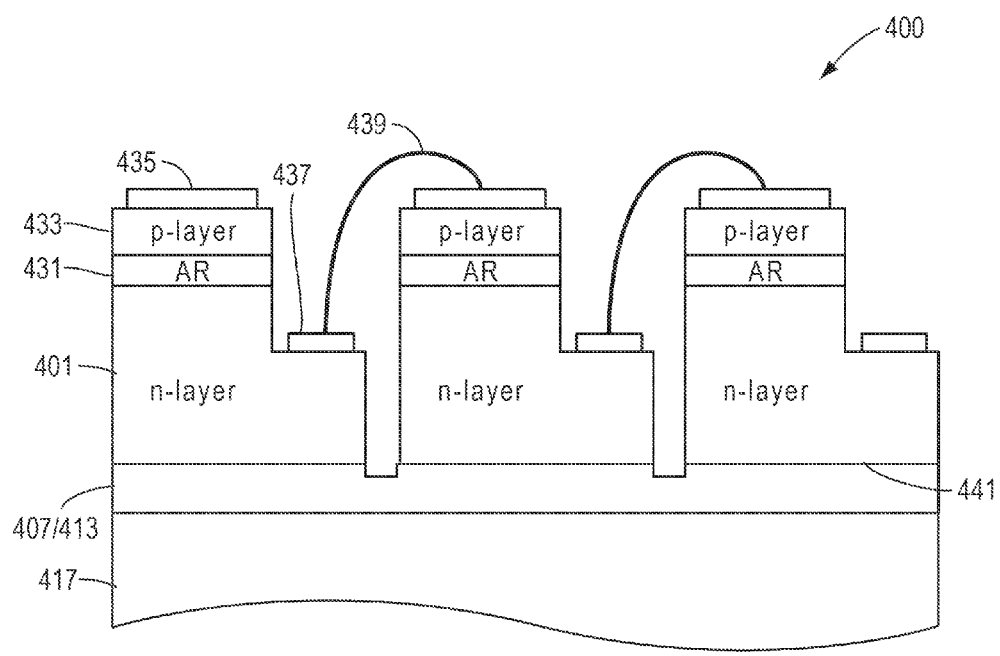
FIG. 4 is a diagram of a device structure according to an embodiment of the present invention.

In one specific embodiment, shown schematically in FIG. 4, the wafer is used to fabricate a high-voltage LED. In a preferred embodiment, nitride layer 401 is n-type doped, to a level between about $10^{17}$ cm$^{-3}$ and about $3\times10^{18}$ cm$^{-3}$, and handle substrate 417 has a coefficient of thermal expansion that is approximately matched to that of nitride layer 401. In a preferred embodiment, handle substrate 417 is an electrical insulator. Nitride layer 401 and handle substrate 417 are bonded by means of adhesion layers 407 and 413. Active layer 431 and p-type layer 433 are deposited epitaxially on n-type nitride layer 401 according to methods that are known in the art, such as metalorganic chemical vapor deposition (MOCVD) or molecular beam epitaxy (MBE). Mesa structures are formed to generate singulated devices or form arrayed layouts with the various pixels of the LEDs to be subsequently interconnected. Typically, this will be achieved by utilizing reactive ion etching (RIE) or inductively-coupled plasma (ICP) dry etching or photo-electrochemical (PEC) etching to etch through the active region to expose the n-GaN layer. A layer of n-type AlGaN may serve as an etch stop during the mesa-forming process. A second etch process is then performed to expose the electrically inactive adhesion layers 407/413 and/or handle substrate 417 and is desirable to prevent conduction between the n-electrodes of adjacent pixels. The adhesion layers 407/413 and/or handle substrate 417 may serve as a selective stop-etch layer. The p-electrodes 435 are then deposited upon the mesa tops and may be substantially transparent to allow for a top-emitting device configuration. Transparency should be coupled with sufficient current spreading and may be achieved by utilizing an indium tin oxide (ITO) or zinc oxide (ZnO) layer, a thin metal layer (Ni/Au, Pt/Au, Pd/Au, Ag, Pt/Ag), or a mesh grid (not shown) for the p-electrode. A second isolation (passivation) layer, which may consist of a dielectric material such as SiO$_2$ or Si$_x$N$_y$, may then be deposited over the mesas. This layer isolates the interconnect metal from shorting an adjacent device and serves as a passivation mechanism for the active region sidewalls. Finally, a second metal layer 437 is deposited to provide the n-electrode of each device and to enable interconnection of adjacent pixels. Several common embodiments for the n-electrode are Al/Au, Ti/Au, Al/Ni/Au, or Ti/Al/Ni/Au. The contacts may be heat treated or annealed to form ohmic or near-ohmic contracts. At least two, three, four, five, six, eight, ten, twelve, 15, 20, 25, 30, 40, 50, 60, 75, or more LEDs may be interconnected in series by means of wire bonds 439 to form a multi-pixel high-voltage LED. The LED may be operated at a voltage greater than 10V, greater than 20V, greater than 40, or greater than 100V.

Optionally, the high-voltage LED may be flip-chip bonded to a carrier substrate for improved extraction of light and/or or heat. Handle substrate 401 may be shaped or removed for improved light extraction. Handle substrate 401 may be removed by methods that are known in the art, such as laser lift-off, grinding, or lapping. Adhesion layers 407 and 413 may be removed by chemical etching, electrochemical etching, anodization, lapping, or the like. The back side 441 of nitride layer 401 may be patterned or roughened by methods that are known in the art, such as chemical etching or photoelectrochemical etching to improve light extraction. Light extraction may be optimized by means of microcavity effects, surface roughening, or formation of a photonic lattice, as described in U.S. patent application Ser. Nos. 12/569,337; 12/569;841; and 12/569,844; each of which is incorporated by reference in their entirety. The high-voltage LED may be singulated and incorporated into a package according to methods that are known in the art. One or more high-voltage LEDs 400 may be mounted in a fixture and incorporated into a lighting system. High-voltage LED 400 may be further processed according to methods described in U.S. Patent Application Ser. No. 61/362,584, which is hereby incorporated by reference in its entirety.

In some embodiments, as noted above, the nitride crystal may have threading dislocations that are arranged inhomogeneously as a two-dimensional array of high-dislocation-density regions, which will be referred to as cores, within a matrix of low-dislocation-density regions. Devices may be arranged with specific spatial arrangements with respect to the cores in order to optimize the yield or performance of the devices. In other embodiments, the nitride crystal may have threading dislocations that are arranged inhomogeneously as a one-dimensional array of alternating high-dislocation-density stripes and low-dislocation-density stripes.

Figure 5:
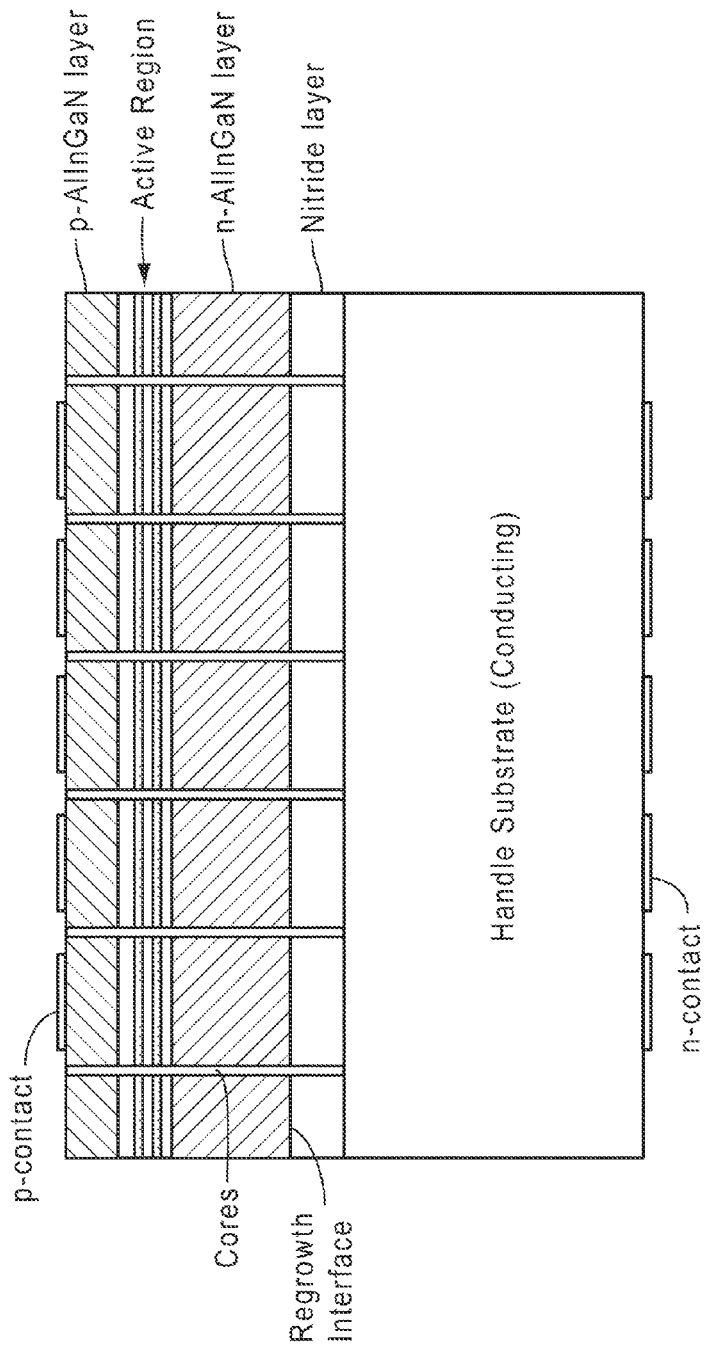
FIG. 5 is a diagram of a vertical device structure according to an embodiment of the present invention.

FIG. 5 shows an LED epi layer structure grown on a GaN-on-handle (GaNOH) wafer, where the handle substrate is electrically conductive. The layer structure consists of at least one n-type (Al,Ga,In)N layer grown on top of the GaNOH wafer, followed by an active region with at least one and more typically multiple (Al,Ga,In)N layers. The active region is followed by at least one p-type (Al,Ga,In)N layer. The layer structures can be grown by either metal-organic chemical vapor deposition (MOCVD) or atomic-layer chemical vapor deposition (ALCVD) or atomic layer epitaxy (ALE) or molecular beam epitaxy (MBE).

In one embodiment, the GaNOH wafer consists of a very low dislocation density GaN ($<10^6$-$10^7$ cm$^{-2}$) layer. The low dislocation density GaN layer can be formed by either dislocation bundling into organized cores or by using nanomasking approaches resulting in randomized cores. The circular regions encircling the cores have a gradient in dislocation or defect density and are known as the shell region. The regions between the shells are referred to as interstitial regions. The dopants in the shell and interstitial regions could be the same or different. Typical dopants are Si, O, P, Mg, etc.

Figure 6:
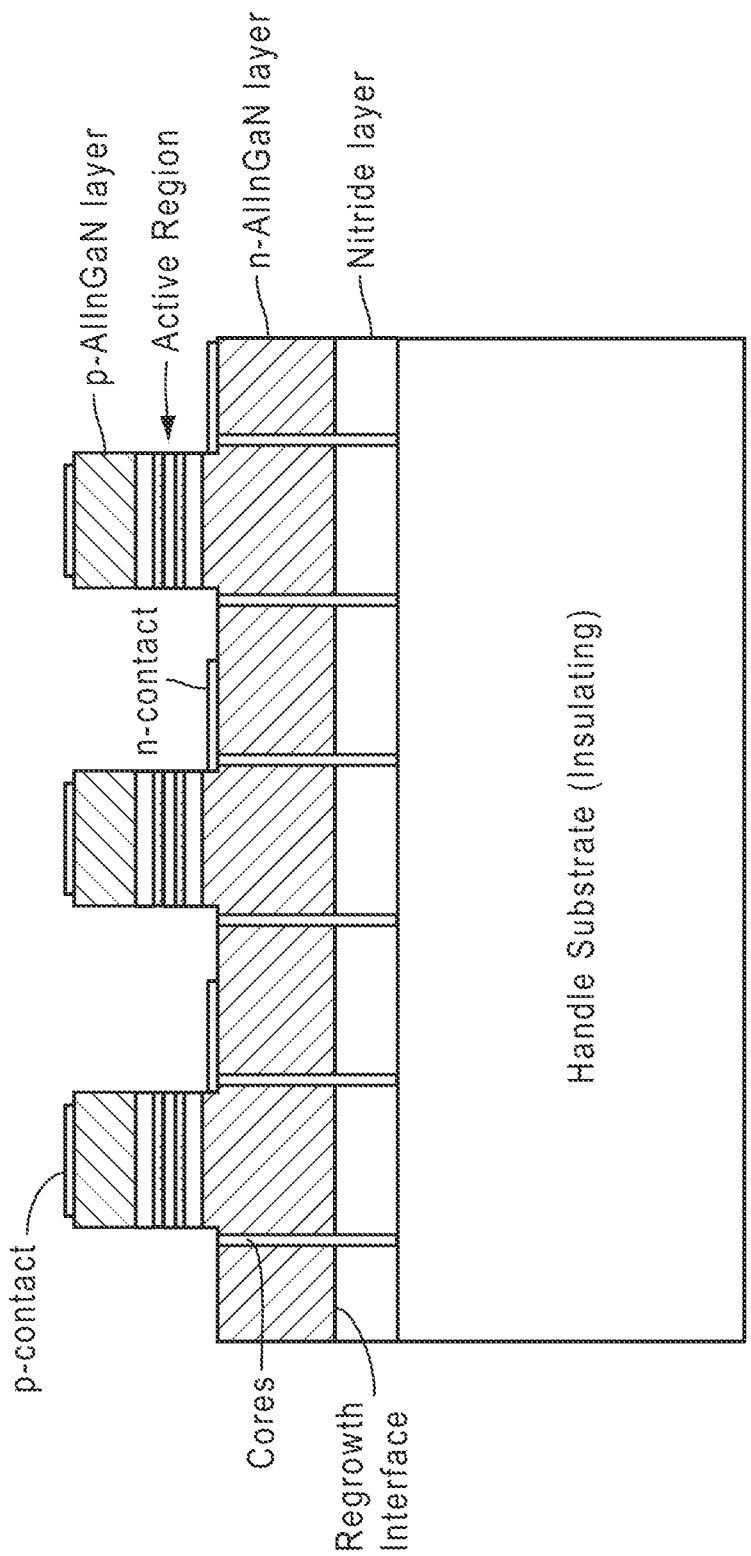
FIG. 6 is a diagram of a lateral device structure according to an embodiment of the present invention.

FIG. 6 shows an LED epi layer structure grown on a GaN-on-handle (GaNOH) wafer, where the handle substrate is electrically insulating. The layer structure consists of at least one n-type (Al,Ga,In)N layer grown on top of the GaNOH wafer, followed by an active region with at least one and more typically multiple (Al,Ga,In)N layers. The active region is followed by at least one p-type (Al,Ga,In)N layer. Mesas are formed by etching through portions of the p-type and active layers and n-type and p-type contacts placed in the troughs between mesas and on top of the mesas, respectively.

Figure 7:
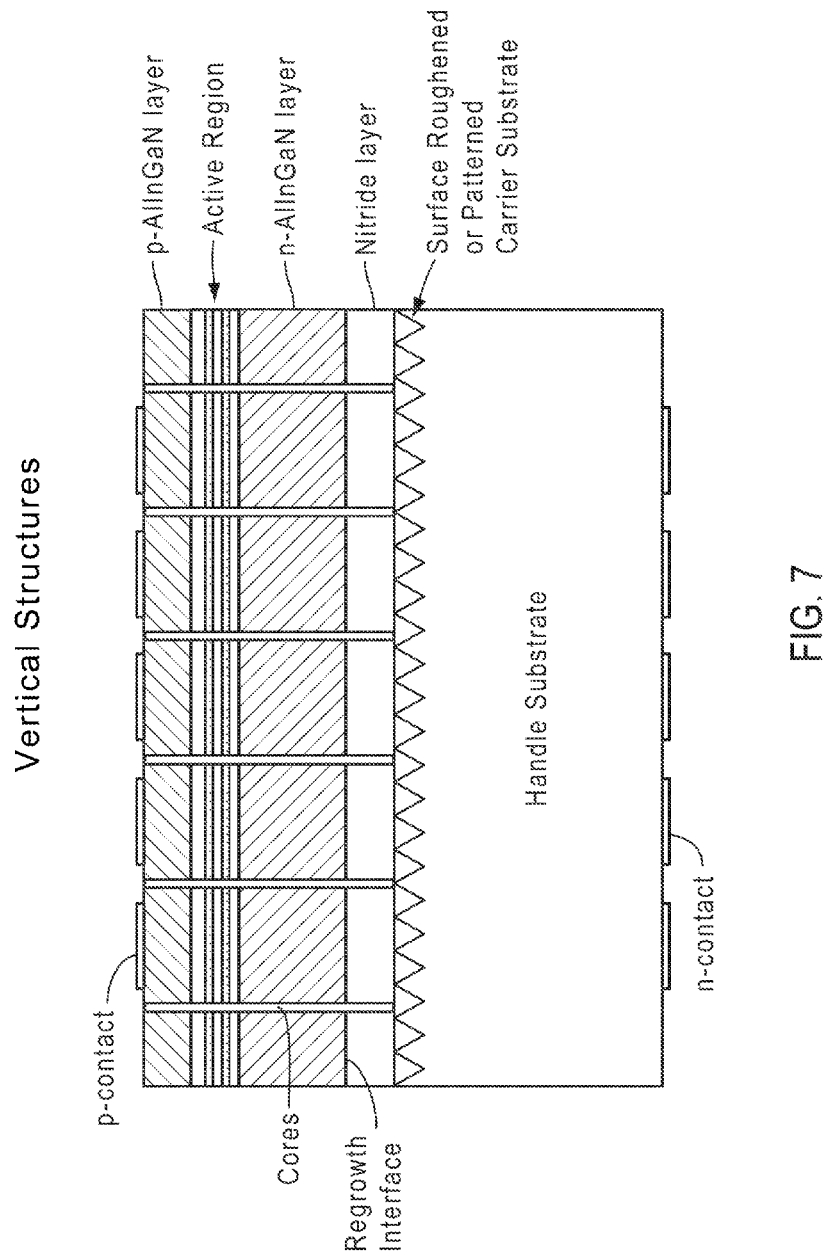
FIG. 7 is a diagram of a vertical device structure having a roughened or patterned interface according to an embodiment of the present invention.

FIG. 7 shows an LED epi layer structure grown on a roughened or a patterned GaNOH wafer, where the handle substrate is electrically conductive. The roughened or the patterned GaNOH wafer allows light scattering at the back side and improves light extraction from the LED device. The epi layer structure is similar to the one described in FIG. 5.

Figure 8:
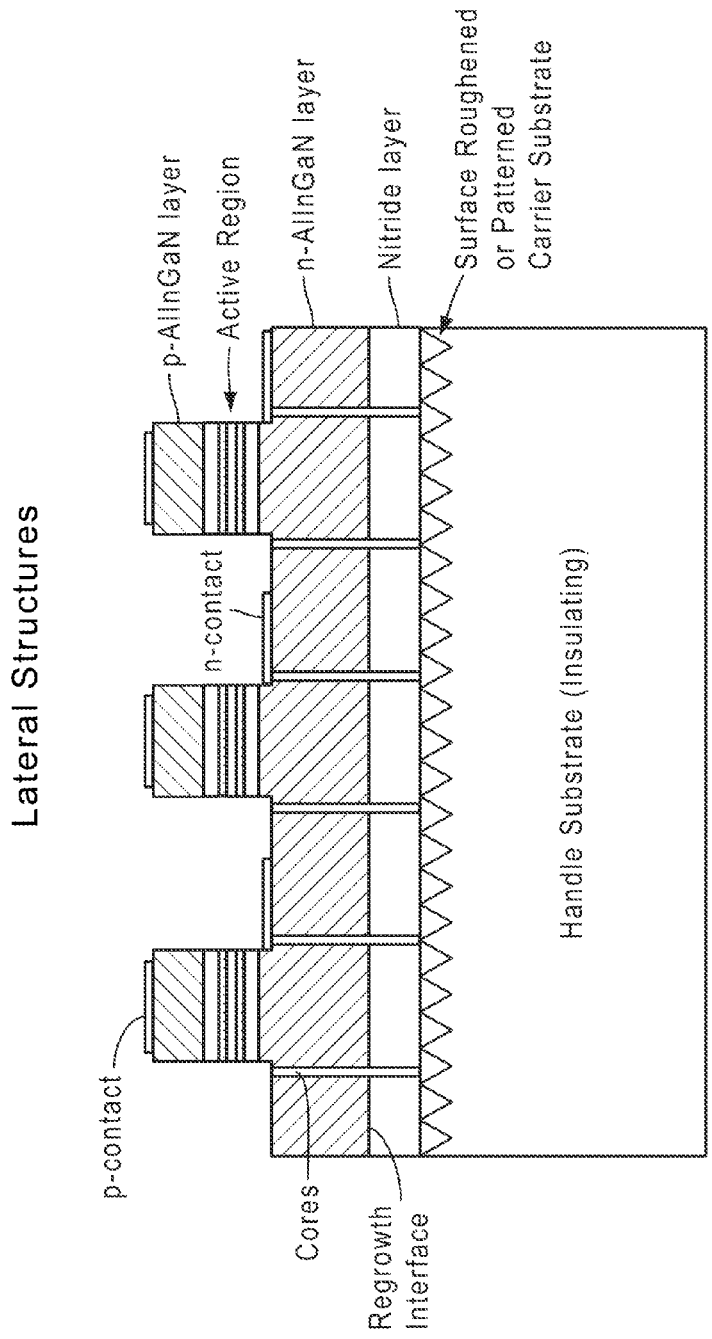
FIG. 8 is a diagram of a lateral device structure having a roughened or patterned interface according to an embodiment of the present invention.

FIG. 8 shows an LED epi layer structure grown on a roughened or a patterned GaNOH wafer, where the handle substrate is electrically insulating. The roughened or the patterned GaNOH wafer allows light scattering at the back side and improves light extraction from the LED device. The epi layer, mesa, and electrical contact structures are similar to the ones described in FIGS. 5 and 6.

Figure 9A:
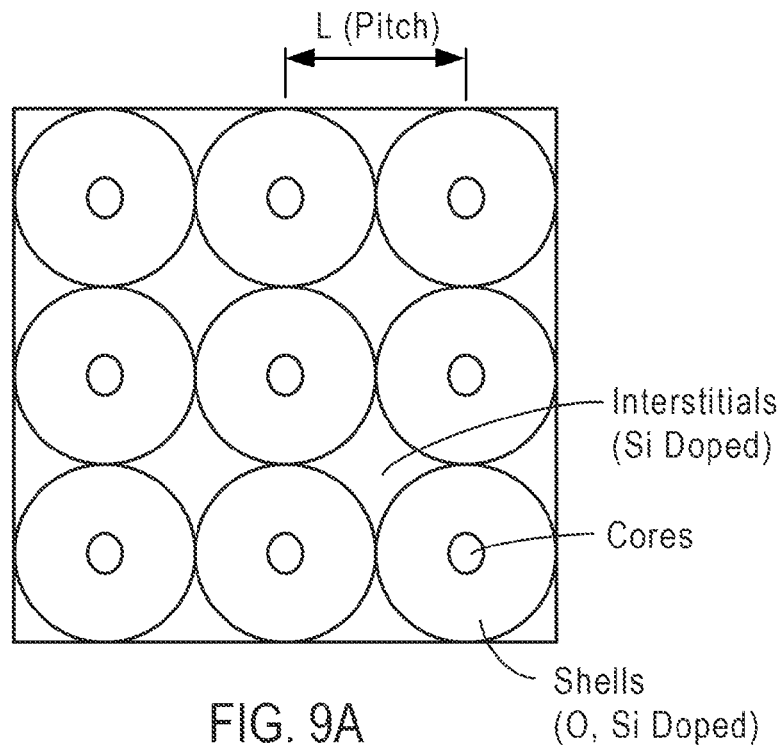
FIGS. 9A-9C are diagrams of a vertical device structure on a patterned substrate according to an embodiment of the present invention.
Figure 9B:
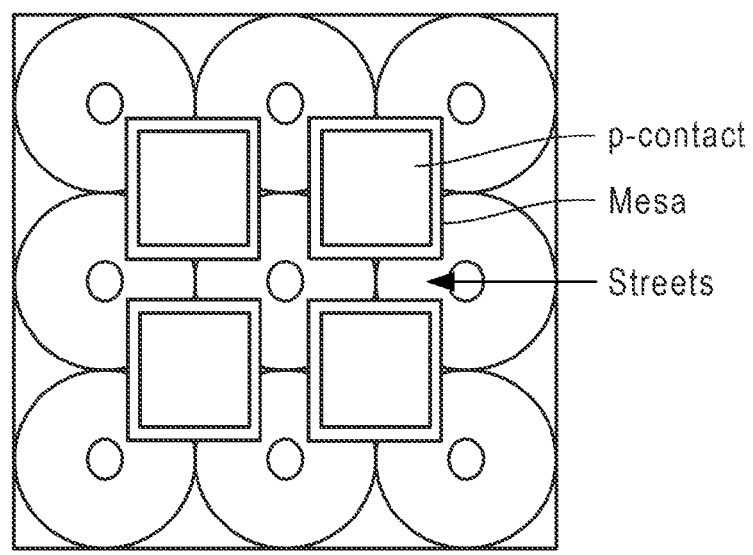
Figure 9C:
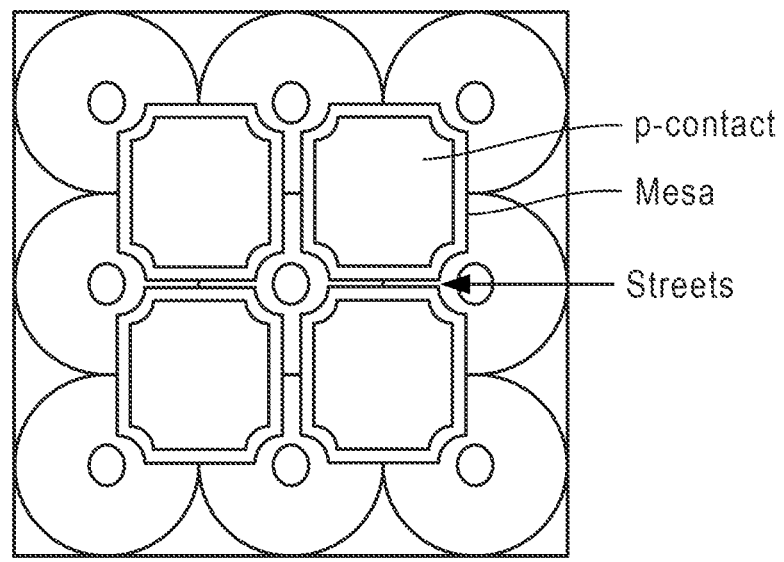

In the case of a wafer with organized dislocation cores, in a preferred embodiment the devices are formed between the core regions. FIGS. 9A-9C show the device layout using a square pitch GaNOH substrate, where the handle substrate is electrically conductive. The position of the p-contact, mesa and streets are shown in the figure. The substrate can have different regions with different dopant species and with different doping concentrations. The shell region encircles the core region and the interstitial regions are the region between the shells. There may be a gradient in defect density from the core region to the interstitial region. The pitch is defined by the spacing between two adjacent (nearest) cores. In one configuration, the LED consists of a square p-contact and a square mesa. In another configuration, the LED consists of a dog-ear pattern next to the core regions for p-contact and mesa. The core region of the substrate have very high density of extended defects and they can easily form a vertical current path. The cores could therefore be utilized as a shunt path for reducing series resistance in lateral device geometries.

Figure 10A:
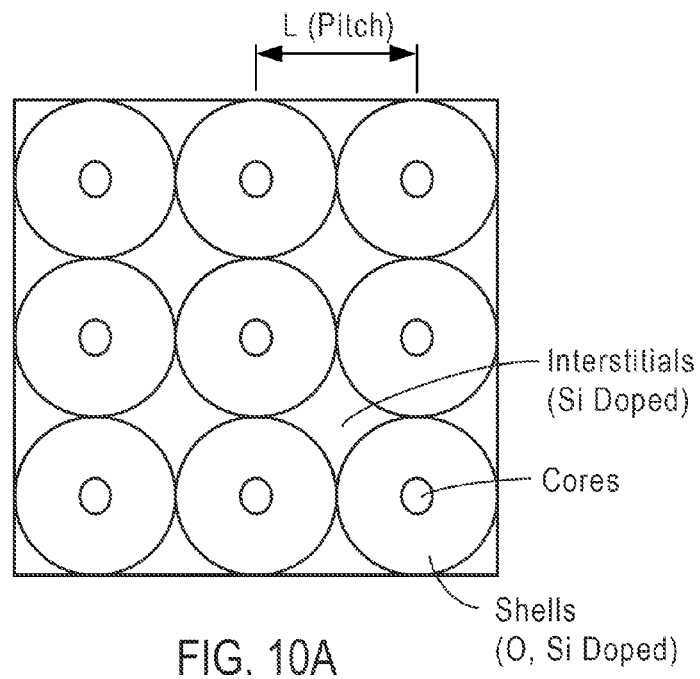
FIGS. 10A and 10B are diagrams of a lateral device structure on a patterned substrate according to an embodiment of the present invention.
Figure 10B:
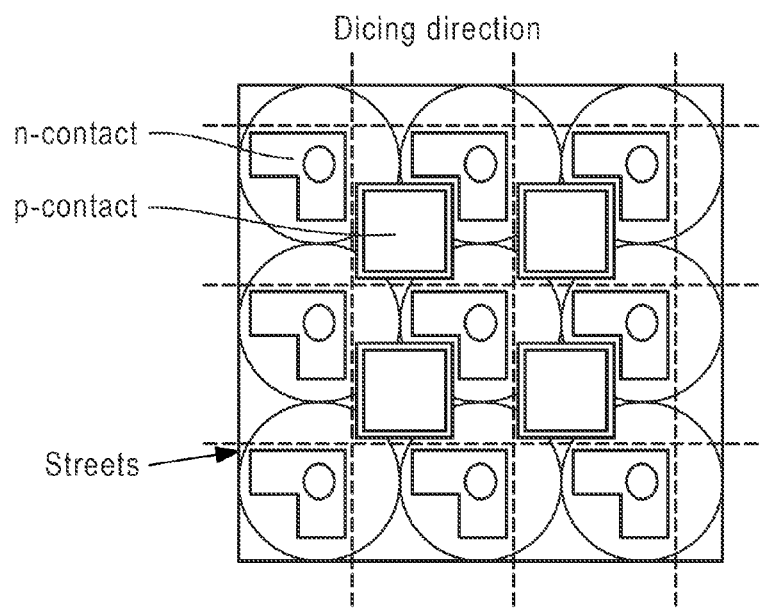

FIGS. 10A and 10B show a device layout using a square pitch GaNOH substrate, where the handle substrate is electrically insulating. The position of the p-contact, mesa and streets are shown in the figure. Mesas may be formed by etching around the regions that will form the p-contact through the active layer and into the n-type material (either above or below the regrowth interface), and n-type and p-type contacts deposited. In one specific embodiment, the p-type contacts may be located predominantly over the interstitial regions and the n-type contacts may overlap the cores. In some embodiments at least one of the p-type contacts and the n-type contacts are transparent or semi-transparent. After deposition of the contacts the die may be singulated by sawing or scribing and breaking along the dashed lines in FIG. 10B.

Figure 11:
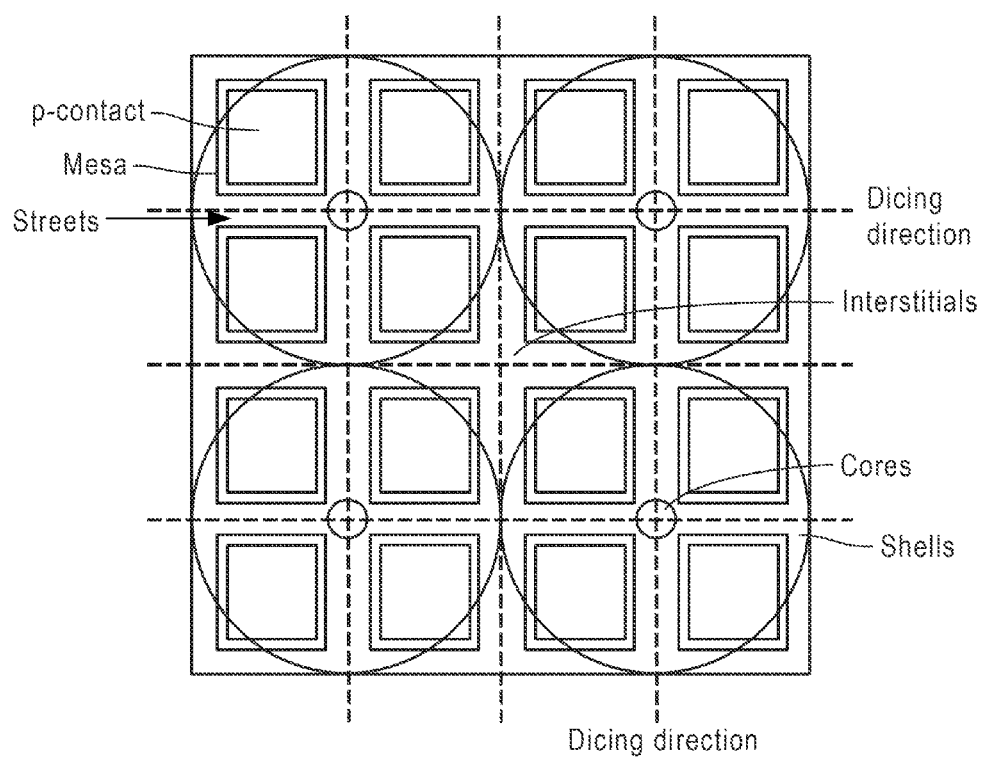
FIG. 11 is a diagram of a device structure on a patterned substrate illustrating singulation methods according to an embodiment of the present invention.

In another configuration, shown in FIG. 11, several square devices may be laid out between two adjacent core regions. Following the fabrication of the devices, the wafer may be diced in the direction shown in the figure for singulation. The preferred directions to dice or scribe are either parallel or perpendicular to the m-plane of the wurtzite-structure nitride layer.

Figure 12A:
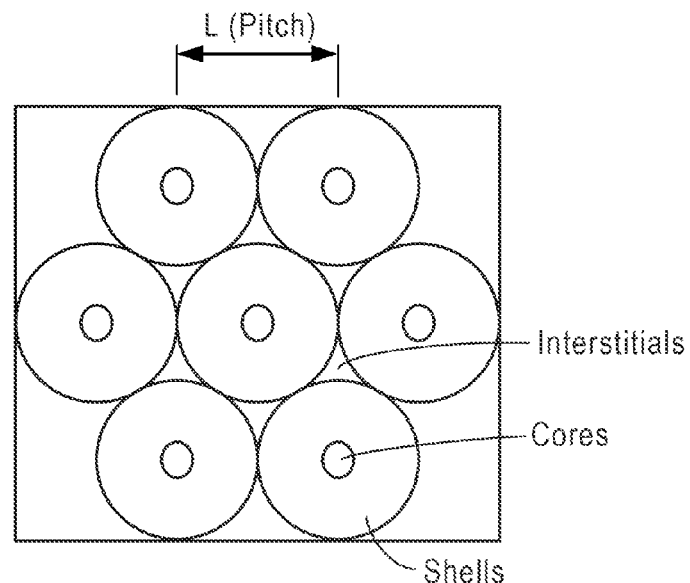
FIGS. 12A and 12B are diagrams of an alternative device structure on a patterned substrate illustrating singulation methods according to an embodiment of the present invention.
Figure 12B:
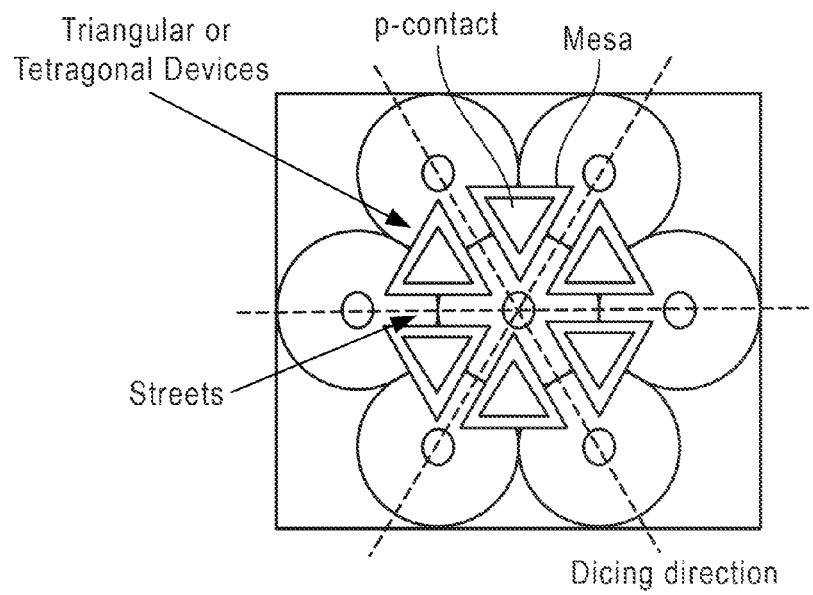
Figure 13A:
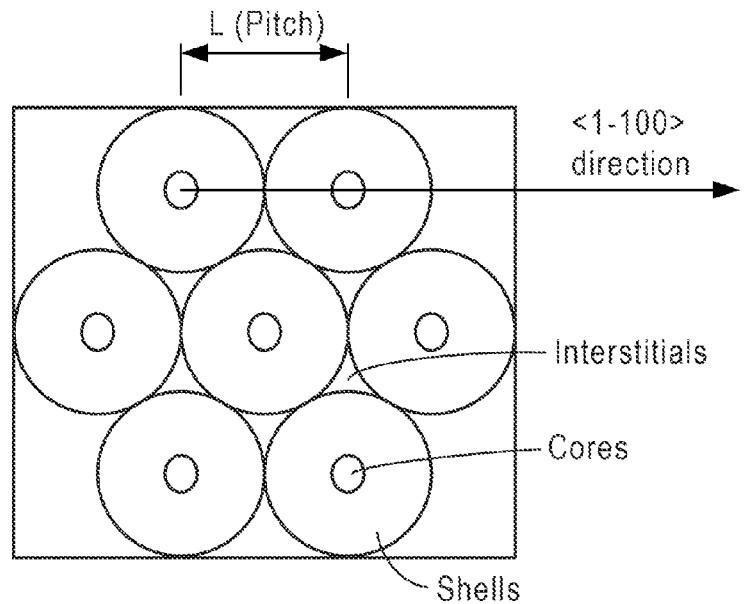
FIGS. 13A-13D are diagrams of additional device structures on a patterned substrate illustrating singulation methods according to an embodiment of the present invention.
Figure 13B:
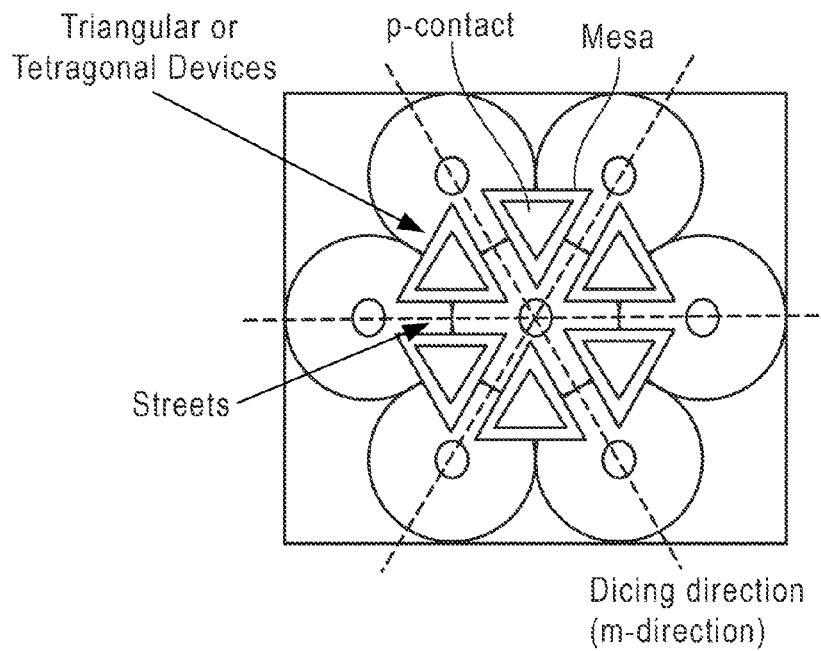
Figure 13C:
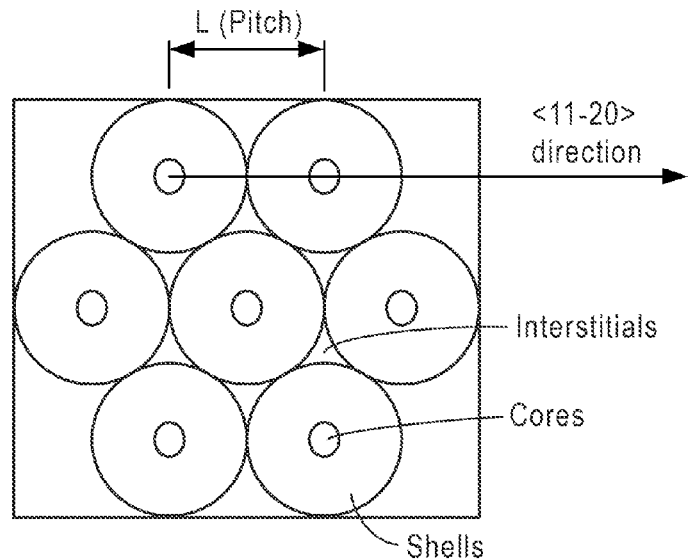
Figure 13D:
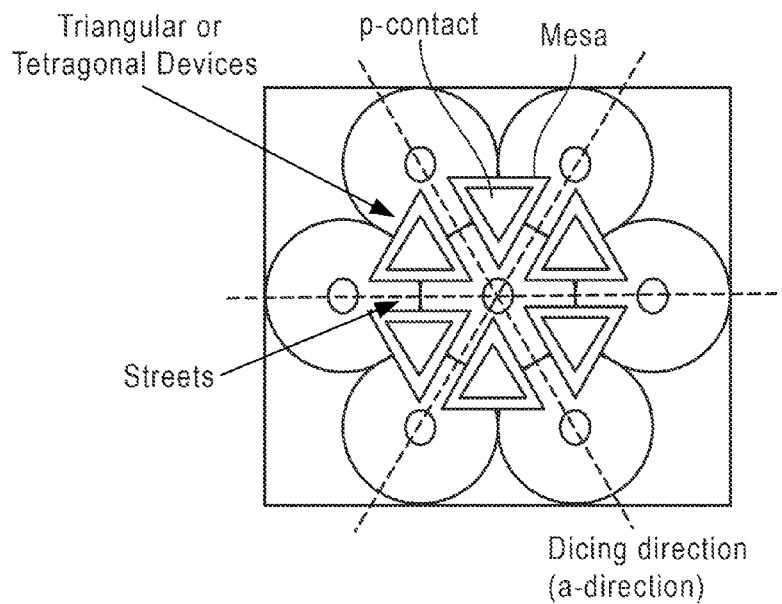

FIGS. 12A and 12B show a device layout using a hexagonal or triangular pitch GaNOH substrate. The positions of the p-contact, mesa and streets are shown in the figure. The substrate can have different regions with different dopant species and with different doping concentrations. In one configuration, the LED consists of a triangular p-contact and a triangular mesa. In another configuration, the LED consists of a dog-ear pattern next to the core regions for p-contact and mesa. The streets and the dicing directions are also shown in the figure.

Several additional core and wafer configurations for hexagonal-pitch dot core wafers are shown in FIGS. 13A-13D. Singulation, by slicing, sawing, or cleaving, may be performed along m-planes or along a-planes.

Figure 14:
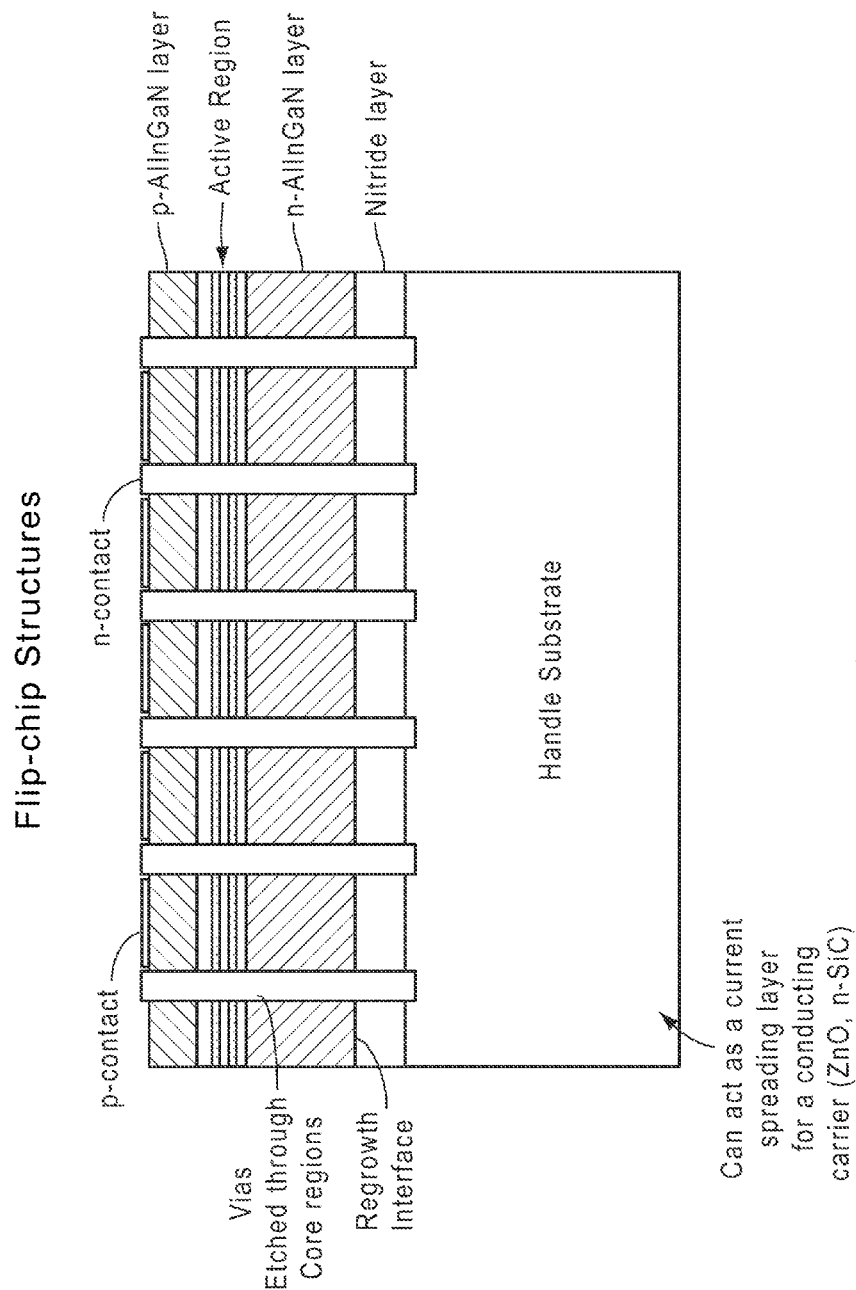
FIG. 14 is a diagram showing a side view of a flip-chip device structure according to an embodiment of the present invention.
Figure 15:
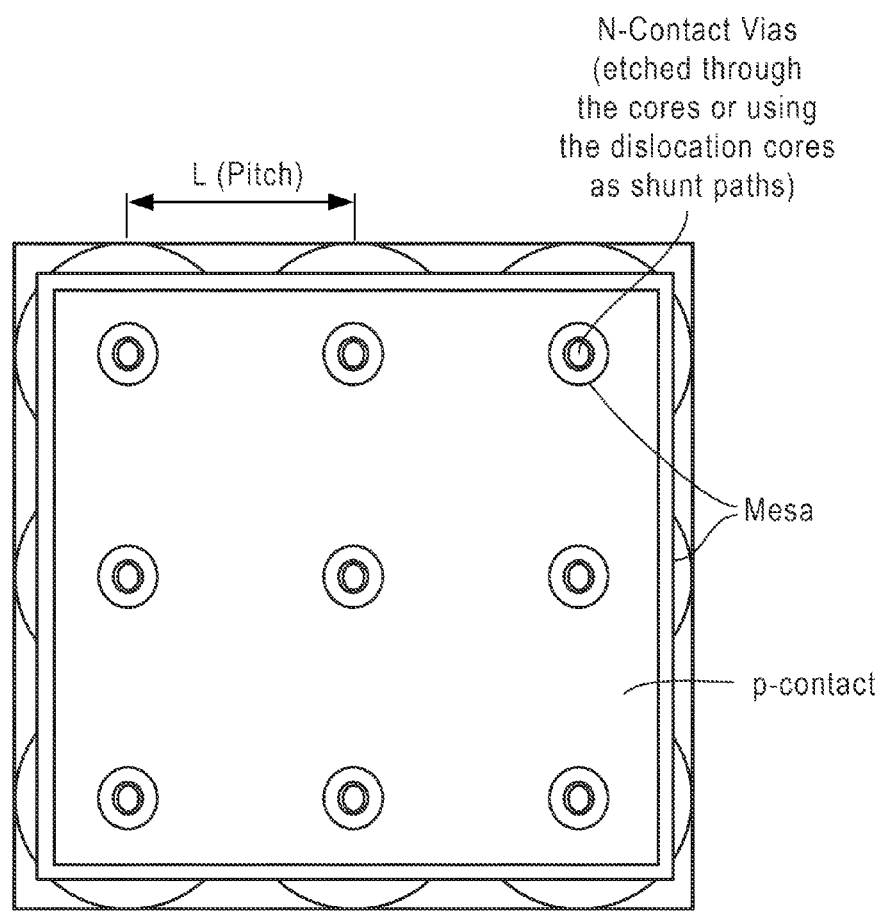
FIG. 15 is a diagram showing a top view of a flip-chip device structure according to an embodiment of the present invention.

FIG. 14 shows a device layout in a flip-chip configuration. In one specific embodiment with this configuration, vias are etched through the core region of the wafer. Etching may be performed by reaction-ion etching, inductively-coupled plasma etching, or the like. An insulating layer, for example, $SiO_2$ or $SiN_x$, may be deposited on the side walls of the vias and a metal deposited inside the vias to provide n-type contacts. In another specific embodiment, vias are etched around the core regions of the wafer but the cores themselves are not removed and serve as contacts to the n-type layer. The top side view is shown in FIG. 15. N-contacts are formed through the vias, and therefore both n- and p-contacts are formed on the same side of the wafer. Etching vias through the core region removes the defective region of the material and may make the devices more reliable and robust.

Figure 16:
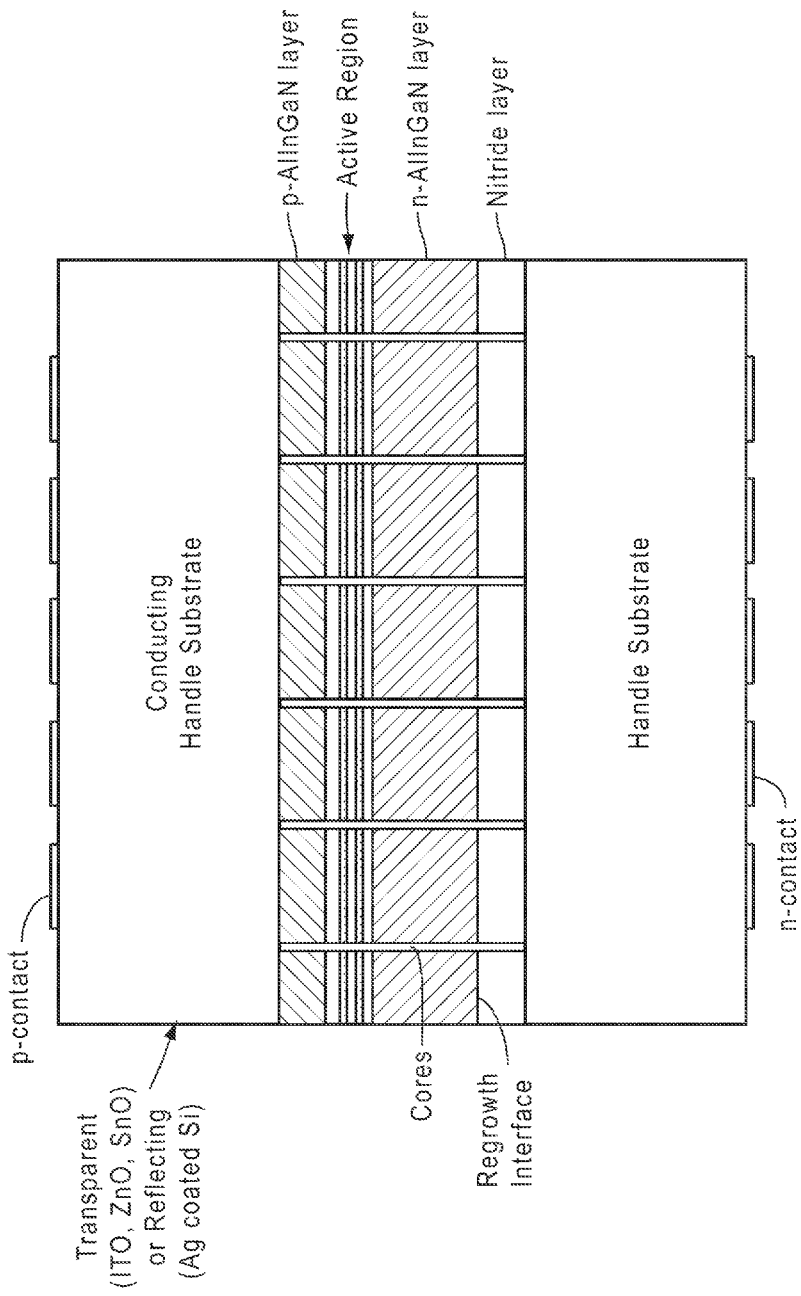
FIG. 16 is a diagram showing a sandwiched vertical device structure according to an embodiment of the present invention.
Figure 17:
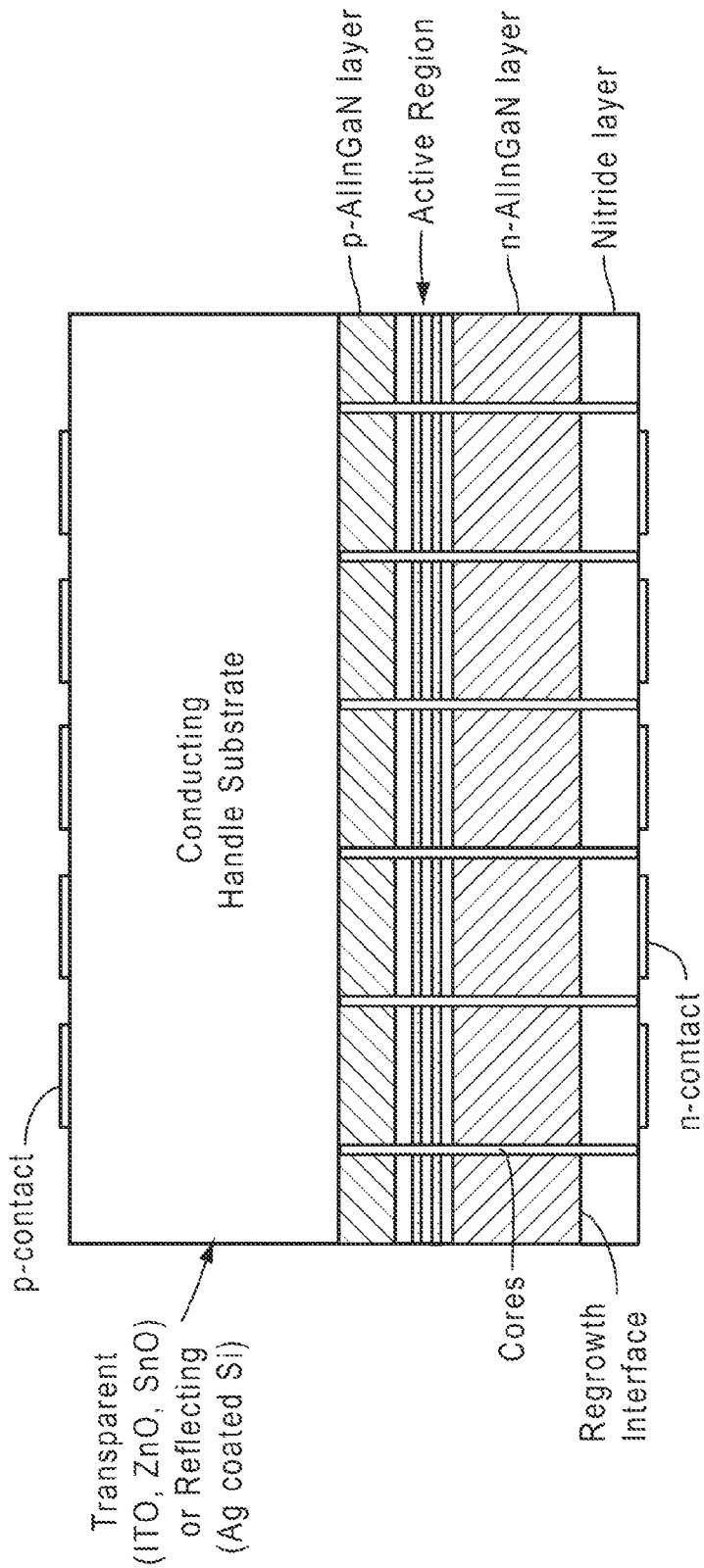
FIG. 17 is a cross-sectional view diagram of a vertical thin-film device structure having a removed handle substrate in one or more embodiments.
Figure 18:
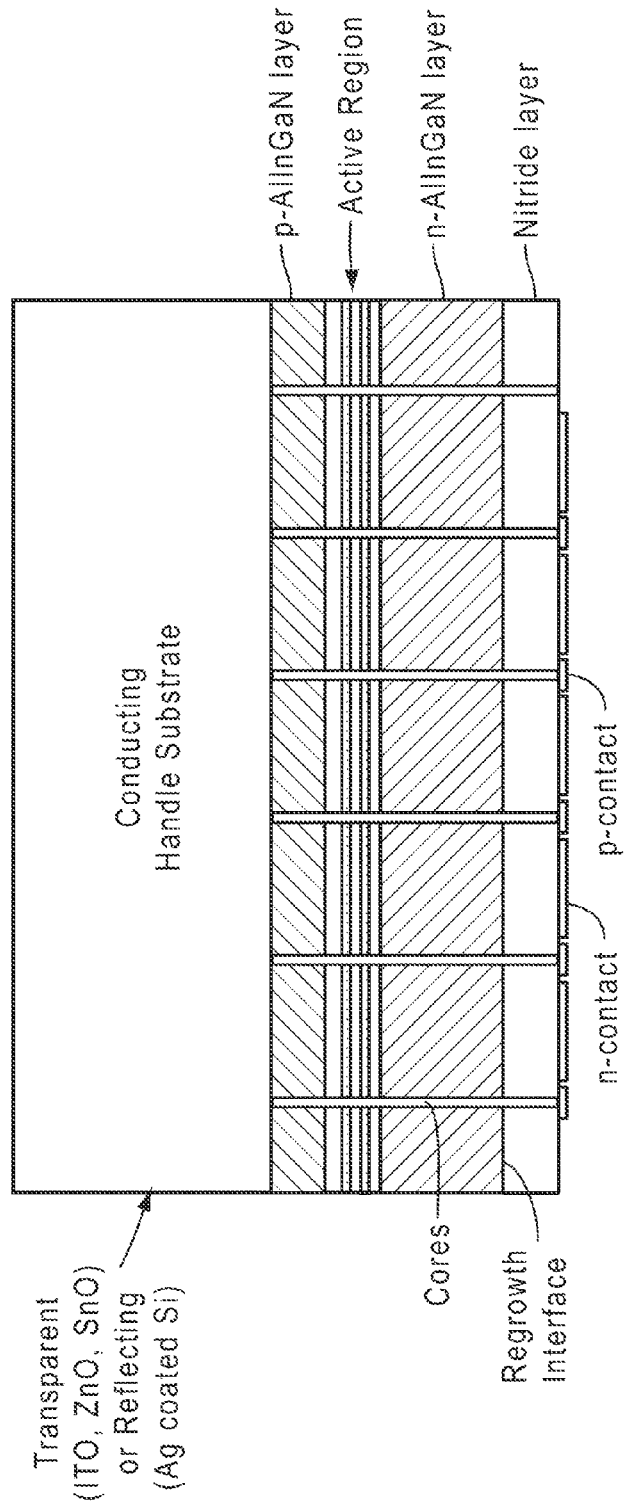
FIG. 18 is a cross-sectional view diagram of a vertical thin-film device structure having a removed handle substrate in one or more embodiments.

FIG. 16 shows a sandwiched vertical structure with a conducting carrier substrate on the p-side. This configuration can be used with transparent conducting substrates like Zinc Oxide, Indium Tin Oxide, Tin-oxide, or the like or reflecting conducting substrates like Ag-coated Silicon, or the like. The conducting carrier substrate could also comprise at least one of $AlO_x$ or $CuO_x$. FIG. 17 is a cross-sectional view diagram of a vertical thin-film device structure having a removed handle substrate, which has been debonded, etched, polished/ground, or cleaved in one or more embodiments. In an alternative embodiment. FIG. 18 is a cross-sectional view diagram of a vertical thin-film device structure having a removed handle substrate, which has been debonded, etched, polished/ground, or cleaved in one or more embodiments.

Figure 19:
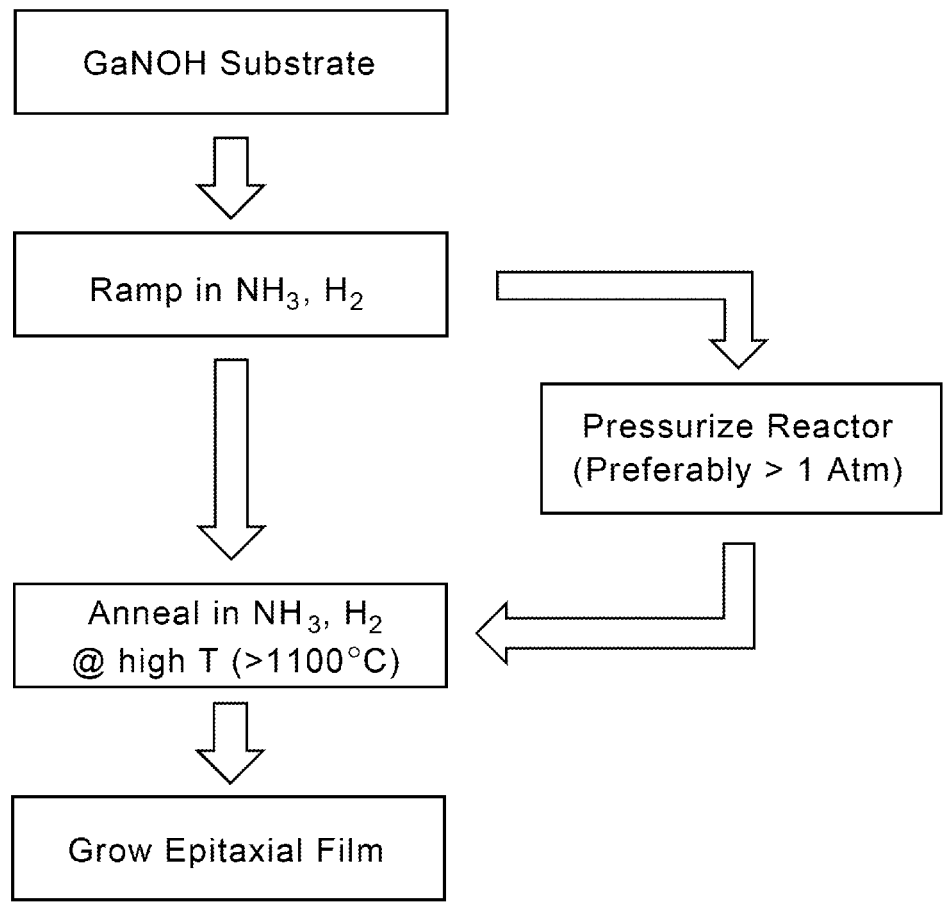
FIG. 19 is a diagram showing a processing sequence of a substrate according to an embodiment of the present invention.

Ion implantantion may lead to defect formation and an implantation annealing may be required post-implantation to recover the original material quality. An in situ annealing step is an attractive way to recover the material from implantation damage. FIG. 19 shows a flow-chart for performing in situ annealing in a MOCVD chamber. The annealing is carried out at high temperature in the presence of ammonia and hydrogen gas. Forming gas and ammonia mixture could also be used. Reactor pressures of approximately one atmosphere or above and temperatures in excess of about 1000 or 1100° C. are preferable for annealing. At least one epitaxial film may be grown following the in situ annealing process.

Figure 20A:
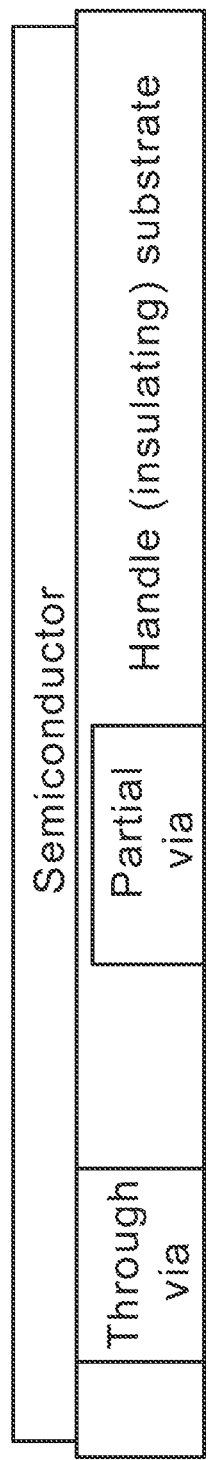
FIGS. 20A-20C are diagrams showing configurations of vias within a substrate according to an embodiment of the present invention.
Figure 20B:
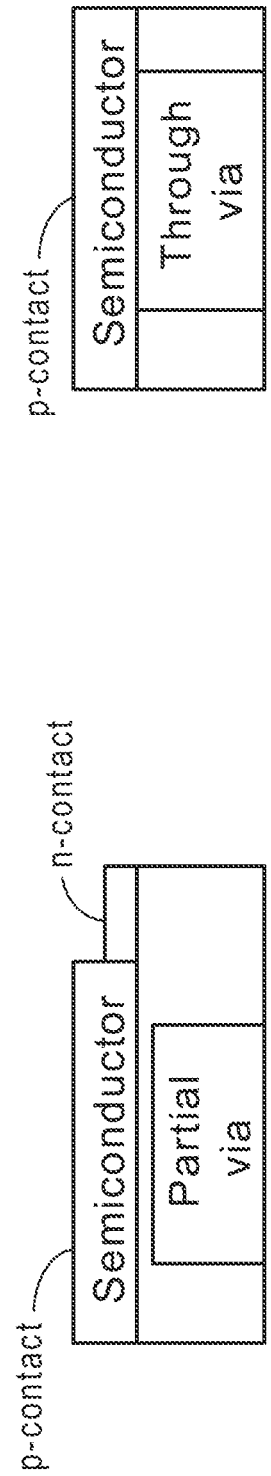
Figure 20C:
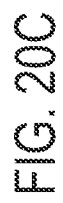

In some embodiments the handle substrate is approximately homogeneous in composition and thickness. In other embodiments, shown schematically in FIGS. 20A-20C, the handle substrate comprises two or more vias or recesses, which may be filled with a conductive material capable of electrical and/or thermal conduction. The vias and/or recesses may be formed either before or after wafer-bonding a nitride layer to the handle substrate. In one set of embodiments, recesses are created in the handle substrate that allow for enhanced thermal conductivity without allowing electrical contact between the material in the recess(es) and the semiconductor materials. The conductive material may comprise a metal, such as copper, silver, or gold, a metal matrix composite, a particle-filled epoxy, silicone, or thermoplastic resin, or another material having a higher thermal conductivity than that of the handle substrate itself. The particles in a composite filler material may comprise at least one of diamond, cubic boron nitride, hexagonal boron nitride, graphite, silver, copper, aluminum nitride, beryllium oxide, aluminum oxide, or silicon carbide. This former geometry may be advantageous by allowing for an integrated thermal path out of a device that would otherwise require special packaging and/or heat sinking.

In another set of embodiments, through-vias are formed that penetrate the handle substrate and allow electrical contact between the conductive material and the semiconductor. This latter geometry may be advantageous for heterogeneous integration of mixed semiconductor technology systems (GaN, GaAs, Si, SiC, etc.) in that it significantly reduces the chip-to-chip interconnection distance reducing power consumption, heating, and interconnect delay.

Figure 21A:
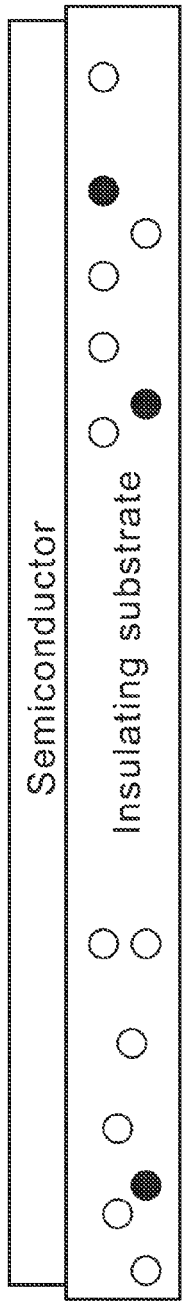
FIGS. 21A and 21B are diagrams showing a substrate comprising light emitting entities according to an embodiment of the present invention.
Figure 21B:
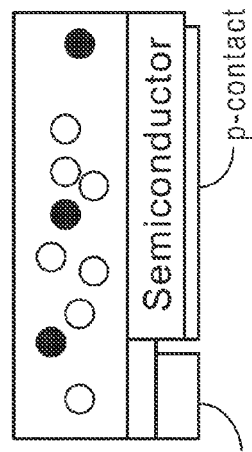

In another specific embodiment, shown schematically in FIGS. 21A and 21B, the handle substrate may further comprise a down-converting light-emitting material, such as a phosphor. This geometry may advantageous as it allows for an integrated light conversion material for generation of white light through photon mixing of different wavelength photons (blue+yellow, for example). In another embodiment, multiple wavelength down-conversion materials are embedded in the substrate. These materials may be able to generate complex spectra when excited by photon emission from the epitaxial light emitting structures grown on them. The handle substrate may further comprise particles or grains having a different index of refraction than the matrix material so as to provide enhanced light scattering.

In a specific embodiment, the one or more entities comprises a phosphor or phosphor blend selected from one or more of $(Y, Gd, Tb, Sc, Lu, La)_3(Al, Ga, In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is selected from one or more of $(Gd,Y,Lu,La)_2O_3:Eu^{3+}, Bi^{3+}$; $(Gd,Y,Lu,La)_2O_2S:Eu^{3+}, Bi^{3+}$; $(Gd,Y,Lu,La)VO_4:Eu^{3+}, Bi^{3+}$; $Y_2(O,S)_3:Eu^{3+}$; $Ca_{1-x}Mo_{1-y}Si_yO_4$:, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2-}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)MgxP_2O_7:Eu^{2+}, Mn^{2+}$; $(Y,Lu)_2WO_6:Eu^{3+}, Mo^{6+}$; $(Ba,Sr,Ca)_3MgxSi_2O_8:Eu^{2+}, Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y, Gd, Lu, La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{13}$; $M_mO_nX$ wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In one or more embodiments, wavelength conversion materials can be ceramic, thin-film-deposited, or discrete particle phosphors, ceramic or single-crystal semiconductor plate down-conversion materials, organic or inorganic down-converters, nanoparticles, or any other materials which absorb one or more photons of a primary energy and thereby emit one or more photons of a secondary energy ("wavelength conversion"). As an example, the wavelength conversion materials can include, but are not limited to the following:
$(Sr,Ca)_{10}(PO_4)6*DB_2O_3:Eu^{2+}$ (wherein $0 < n_1$)
$(Ba,Sr,Ca)_5(PO_4)_3(Cl,F,Br,OH):Eu^{2+},Mn^{2+}$
$(Ba,Sr,Ca)BPO_5:Eu^{2+},Mn^{2+}$
$Sr_2Si_3O_8*2SrC_{12}:Eu^{2+}$
$(Ca,Sr,Ba)_3MgSi_2O_8:Eu^{2+}, Mn^{2+}$
$BaA_{18}O_{13}:Eu^{2+}$
$2SrO*0.84P_2O_5*0.16B_2O_3:Eu^{2+}$
$(Ba,Sr,Ca)MgAl_{10}O_{17}:Eu^{2+},Mn^{2+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2(Mg,Zn)Si_2O_7:Eu^{2+}$
$(Mg,Ca,Sr, Ba,Zn)_2Si_{1-x}O_{4-2x}:Eu^{2+}$ (wherein $0 < x = 0.2$)
$(Sr,Ca,Ba)(Al,Ga,m)_2S_4:Eu^{2+}$
$(Lu,Sc,Y,Tb)_{2-u-v}CevCa_{1-u}LiwMg_{2-w}Pw(Si,Ge)_{3-w}O1_{2-u}/2$ where $-O.SSu\hat{}1$; $0 < v\pounds Q.1$; and $OSw\hat{}O.2$
$(Ca,Sr)_8(Mg,Zn)(SiO_4)_4C_{12}:Eu^{2-},Mn^{2-}$
$Na_2Gd_2B_2O_7:Ce^{3+},Tb^{3+}$
$(Sr,Ca,Ba,Mg,Zn)_2P_2O_7:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3-}$
$(Gd,Y,Lu,La)_xO_4:Eu^{3+},Bi^{3+}$
$(Ca,Sr)S:Eu^{2+},Ce^{3+}$
$(Y,Gd,Tb,La,Sm,Pr,Lu)_3(Sc,Al,Ga)_{5-u}O_{12-3/2}n:Ce^{3+}$ (wherein $0\hat{}0\hat{}0.5$)
$ZnS:Cu+,Cl~$
$ZnS:Cu+,Al^{3+}$
$ZnS:Ag+,Al^{3+}$
$SrY_2S_4:Eu^{2+}$
$CaLa_2S_4:Ce^{3+}$
$(Ba,Sr,Ca)MgP_2O_7:Eu2+,Mn^{2+}$
$(Y,Lu)_2WO_6:Eu^{3+},Mo^{6+}$
$(Ba,Sr,Ca)nSinNn:Eu^{2-}$ (wherein $2_{n+4}=3n$)
$Ca_3(SiO_4)Cl_2:Eu^{2+}$
$ZnS:Ag+,Cl~$
$(Y,Lu,Gd)_{2-n}CanSi_4N_{6-n}C_{1-n}:Ce^3+$, (wherein $OSn\hat{}O.5$)
$(Lu,Ca,Li,Mg,Y)alpha-SiAlON$ doped with $Eu^{2+}$ and/or $Ce^{3+}$
$(Ca,Sr,Ba)SiO_2N_2:Eu^{2+},Ce^{3+}$ For purposes of the application, it is understood that when a phosphor has two or more dopant ions (i.e., those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A gallium and nitrogen containing device comprising:
   a gallium and nitrogen containing material, wherein,
      the gallium and nitrogen containing material comprises a first surface region, a second surface region, and at least one core region;
      the first surface region is opposite the second surface region; and
      the at least one core region extends between the first surface region and the second surface region and through the gallium and nitrogen containing material;
   an interface region overlying the second surface region;
   at least one n-type epitaxial growth region overlying the interface region;
   a core structure extending from the at least one core region through the at least one n-type epitaxial growth region;
   an active region overlying the at least one n-type epitaxial growth region;
   a p-type region overlying the active region;
   a first handle substrate overlying the p-type region, wherein the first handle substrate is transparent, substantially transparent, or reflective; and
   at least one p-contact region overlying the first handle substrate.

2. The device of claim 1, wherein the interface region is characterized by a defect density of less than about $10^6$ cm$^{-2}$ to $10^7$ cm$^{-2}$ within a matrix region between adjacent core regions.

3. The device of claim 1, wherein the gallium and nitrogen containing material is provided from a dot core substrate.

4. The device of claim 1, wherein the first surface region comprises a patterned, textured, or roughened surface structure.

5. The device of claim 1, wherein,
   the at least one core region comprises a plurality of core regions; and
   the plurality of core regions form a square array and a die is approximately square.

6. The device of claim 1, wherein,
the at least one core region comprises a plurality of core regions; and
the plurality of core regions form a hexagonal array and a die is approximately triangular.

7. The device of claim 1, further comprising:
an adhesion layer overlying the first surface region;
a second handle substrate comprising a first surface region and a second surface region, wherein,
the first surface region of the second handle substrate is opposite the second surface region of the second handle substrate; and
the second surface region of the second handle substrate overlies the adhesion layer; and
at least one n-contact region overlying the first surface region of the second handle substrate.

8. The device of claim 1, further comprising at least one n-contact region overlying the first surface region.

9. The device of claim 1, wherein the first handle substrate comprises at least one through via or partial via.

10. The device of claim 1, wherein the first handle substrate is transparent or substantially transparent and comprises a down-converting light-emitting material.

11. A gallium and nitrogen containing device comprising:
a gallium and nitrogen containing material, wherein,
the gallium and nitrogen containing material comprises a first surface region, a second surface region, and at least one core region;
the first surface region is opposite the second surface region; and
the at least one core region extends between the first surface region and the second surface region and through the gallium and nitrogen containing material;
an interface region overlying the second surface region;
at least one n-type epitaxial growth region overlying the interface region;
a core structure extending from the at least one core region through the at least one n-type epitaxial growth region;
an active region overlying the at least one n-type epitaxial growth region;
a p-type region overlying the active region;
one or more via or street structures providing an electrical barrier between adjacent core regions and a matrix region between the adjacent core regions;
at least one electrical contact region overlying a core region surrounded by a via or street structure; and
at least one handle substrate.

12. The device of claim 11, wherein the interface region is characterized by a defect density of less than about $10^6$ cm$^{-2}$ to $10^7$ cm$^{-2}$ within the matrix region.

13. The device of claim 11, wherein the gallium and nitrogen containing material is provided from a dot core substrate.

14. The device of claim 11, wherein the first surface region comprises a patterned, textured, or roughened surface structure.

15. The device of claim 11, wherein,
the at least one core region comprises a plurality of core regions; and
the plurality of core regions form a square array and a die is approximately square.

16. The device of claim 11, wherein,
the at least one core region comprises a plurality of core regions; and
the plurality of core regions form a hexagonal array and a die is approximately triangular.

17. The device of claim 11, further comprising:
an adhesion layer overlying the first surface region; and
at least one p-contact region overlying the p-type region, wherein,
the at least one handle substrate comprises a first surface region and a second surface region;
the first surface region is opposite the second surface region;
the second surface region overlies the adhesion layer; and
the at least one electrical contact region comprises an n-type contact region.

18. The device of claim 11, further comprising:
at least one n-contact region overlying the first surface region; and
at least one p-contact region overlying the at least one core region; and
wherein the at least one handle substrate comprises a first transparent or reflective handle substrate overlying the at least one p-type region.

19. The device of claim 11, wherein the at least one handle substrate comprises at least one through via or partial via.

20. The device of claim 11, wherein,
the at least one handle substrate is transparent or substantially transparent; and
the at least one handle substrate comprises a down-converting light-emitting material.

* * * * *